US009287853B2

(12) United States Patent
Nakura et al.

(10) Patent No.: US 9,287,853 B2
(45) Date of Patent: Mar. 15, 2016

(54) SIGNAL CONVERSION CIRCUIT, PLL CIRCUIT, DELAY ADJUSTMENT CIRCUIT, AND PHASE CONTROL CIRCUIT

(75) Inventors: Toru Nakura, Tokyo (JP); Kunihiro Asada, Tokyo (JP)

(73) Assignee: AIKA DESIGN INC., Tokyo (JP)

( * ) Notice: Subject to any disclaimer, the term of this patent is extended or adjusted under 35 U.S.C. 154(b) by 0 days.

(21) Appl. No.: 14/122,822

(22) PCT Filed: May 23, 2012

(86) PCT No.: PCT/JP2012/063206
§ 371 (c)(1),
(2), (4) Date: Mar. 4, 2014

(87) PCT Pub. No.: WO2013/165260
PCT Pub. Date: Dec. 6, 2012

(65) Prior Publication Data
US 2014/0176205 A1    Jun. 26, 2014

(30) Foreign Application Priority Data

May 27, 2011   (JP) ................................. 2011-118627

(51) Int. Cl.
*H03L 7/06* (2006.01)
*H03K 3/01* (2006.01)
(Continued)

(52) U.S. Cl.
CPC ............... *H03K 3/01* (2013.01); *G04F 10/005* (2013.01); *H03K 5/153* (2013.01); *H03L 7/07* (2013.01); *H03L 7/089* (2013.01); *H03L 7/0812* (2013.01); *H03L 7/0816* (2013.01); *H03L 7/099* (2013.01)

(58) Field of Classification Search
CPC ......... H03L 7/0891; H03L 7/18; H03L 7/093; H03L 7/087; H03L 7/10
USPC .................................................. 327/156, 158
See application file for complete search history.

(56) References Cited

U.S. PATENT DOCUMENTS 6,226,506 B1   5/2001   Welland
7,113,047 B2 *  9/2006   Matsunami .................... 331/16
(Continued)

FOREIGN PATENT DOCUMENTS

CN   1108827   9/1995
EP   0670632   9/1995
(Continued)

OTHER PUBLICATIONS

Lim, Peter J., "An Area-Efficient PLL Architecture in 90-nm CMOS," Symposium on VLSI Circuits Digest of Technical Papers, pp. 48-49, Jun. 2005.
(Continued)

*Primary Examiner* — Diana J Cheng
(74) *Attorney, Agent, or Firm* — Rankin, Hill & Clark LLP

(57) ABSTRACT

A signal conversion circuit, a PLL circuit, a delay control circuit and a phase control circuit for promoting miniaturization and for reducing quantization noise. TSTC does not require a low-pass filter of capacitor Cm with large layout area conventionally required for converting pulse width to voltage, which promotes miniaturization and cost reduction. TSTC 8 generates analog voltage adequate for transition state at boundary where pulse signal transits, which reduces quantization noise, compared with conventional digital PLL circuits.

10 Claims, 23 Drawing Sheets

(51) Int. Cl.
*H03L 7/099* (2006.01)
*H03K 5/153* (2006.01)
*G04F 10/00* (2006.01)
*H03L 7/07* (2006.01)
*H03L 7/081* (2006.01)
*H03L 7/089* (2006.01)

(56) References Cited

U.S. PATENT DOCUMENTS

| | | | |
|---|---|---|---|
| 7,330,081 | B1 | 2/2008 | Moshe et al. |
| 2008/0297208 | A1 | 12/2008 | Joubert et al. |
| 2009/0219187 | A1 | 9/2009 | Sun |

FOREIGN PATENT DOCUMENTS

| | | |
|---|---|---|
| EP | 2192689 A1 | 6/2010 |
| JP | 61-227422 | 10/1986 |
| JP | 07-240670 | 9/1995 |
| JP | 09-046195 | 2/1997 |

OTHER PUBLICATIONS

Jung, WY. et al., "A 1.2mW 0.02mm2 2GHz Current-Controlled PLL Based on a Self-Biased Voltage-to-Current Converter," ISSCC Digest of Technical Papers, pp. 310-311, Feb. 2007.
Kim, K. et al., "A 5.4mW 0.0035mm2 0.48ps rms-Jitter 0.8-to-5GHz Non-PLL/DLL All-Digital Phase Generator/Rotator in 45nm SOI CMOS," ISSCC Digest of Technical Papers, pp. 98-100, Feb. 2009.
Gao, X. et al., "Spur-Reduction Technique for PLLs Using Sub-Sampling Phase Detection," ISSCC Digest of Technical Papers, pp. 474-476, Feb. 2010.
International Search Report dated Jun. 19, 2012 filed in PCT/JP2012/063206.
Extended European Search Report dated Feb. 26, 2015 issued in the corresponding European patent application No. 12792508.9.

* cited by examiner

Fig. 4
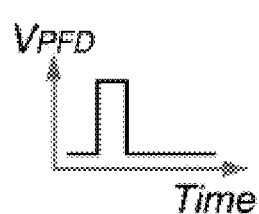
Fig.4 A
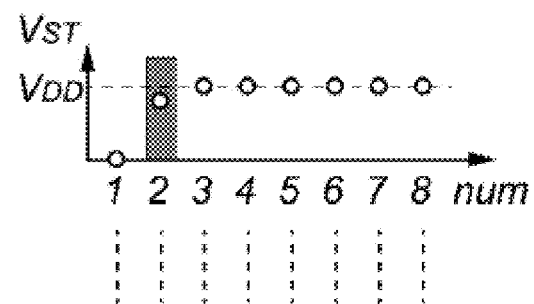
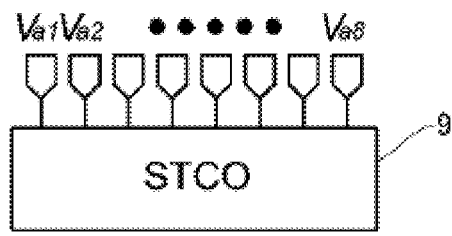
Fig.4 B

Fig. 5
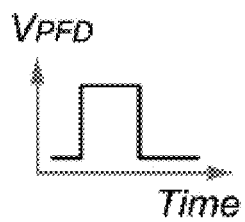
Fig. 5 A
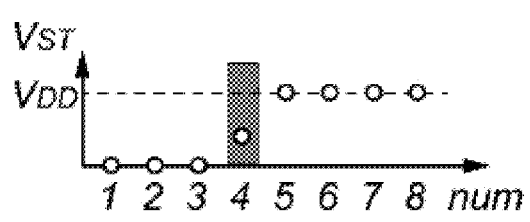
Fig. 5 B
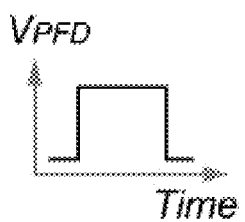
Fig. 5 C
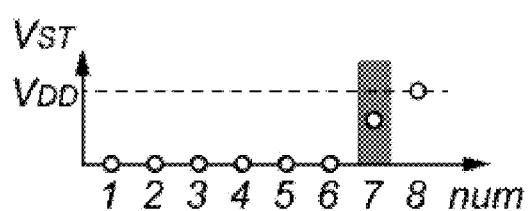
Fig. 5 D Fig. 7
Fig. 7 A
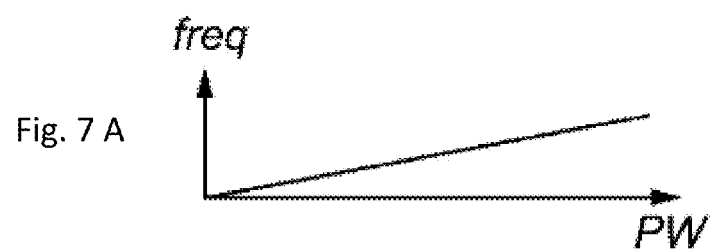
Fig. 7 B
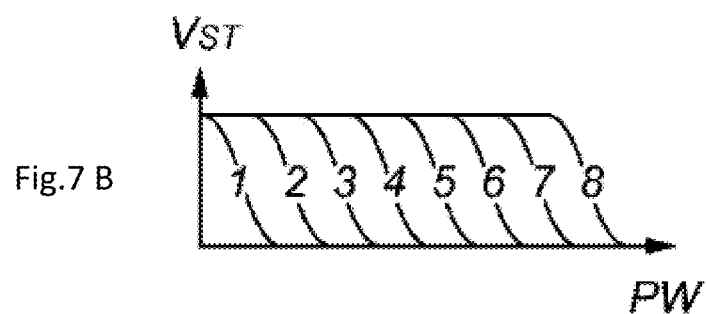

Fig. 12
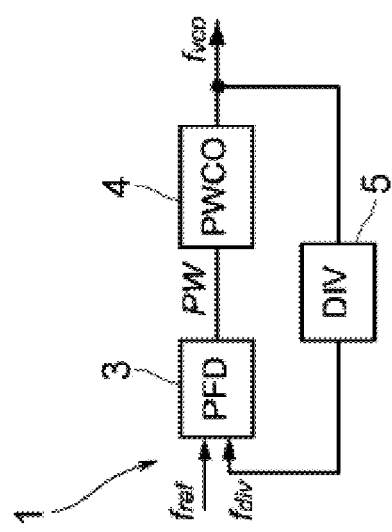
Fig. 12 A
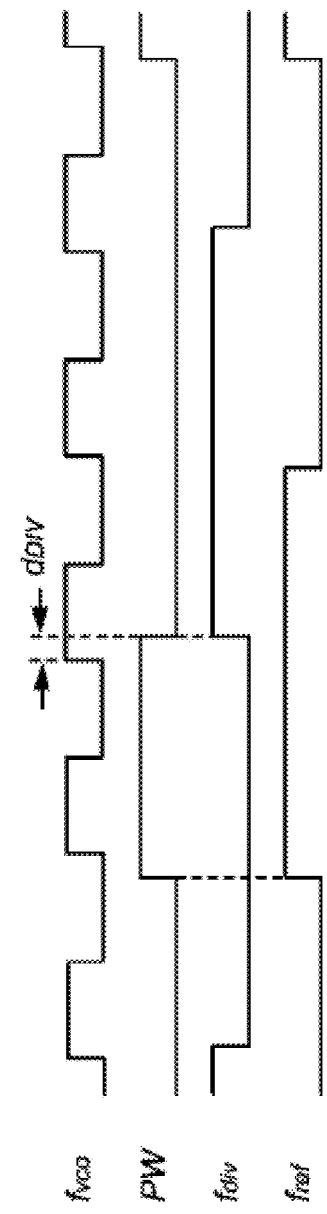
Fig. 12 B

Fig. 18
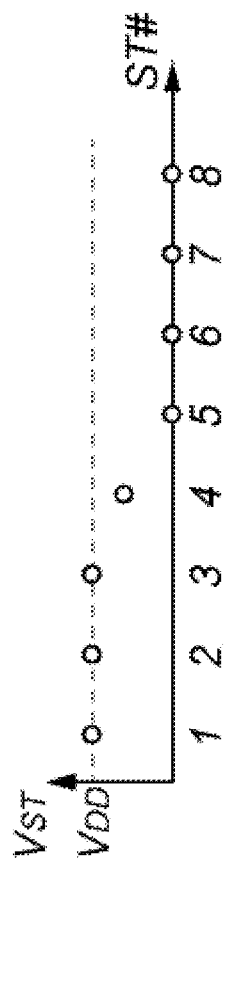
Fig. 18 A
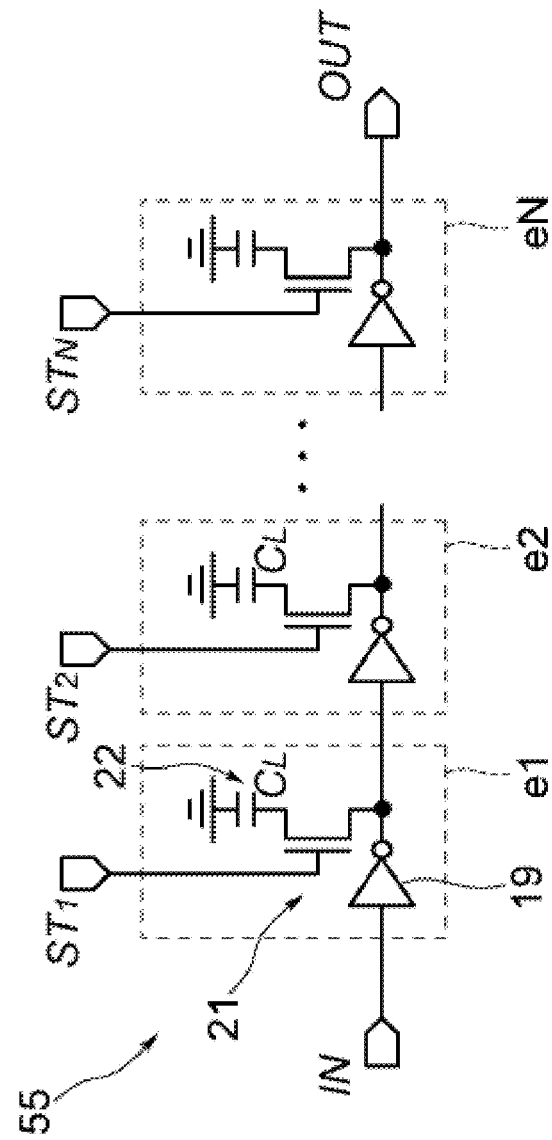
Fig. 18 B

SIGNAL CONVERSION CIRCUIT, PLL CIRCUIT, DELAY ADJUSTMENT CIRCUIT, AND PHASE CONTROL CIRCUIT

TECHNICAL FIELD

The present invention relates to a signal conversion circuit, a PLL (Phase Locked Loop) circuit, a delay adjustment circuit, and a phase control circuit.

BACKGROUND ART

A conventional analog circuit 100, as shown in FIG. 21 (denoted by first conventional analog PLL circuit in the following) is composed of a Phase Frequency Detector (denoted by PFD in the following), a low-pass filter 101 of capacitor Cm, a Voltage Controlled Oscillator 102 (denoted by VCO in the following) and a Divider 5 (denoted by DIV in the following). The VCO 102 in the first conventional PLL circuit 100 is an oscillation circuit which is configured to change an oscillation frequency by controlling voltage and output an intended oscillation frequency from an output unit 6.

Here, a reference clock frequency inputted from outside via an input unit 2 and an oscillation frequency obtained by dividing the output from VCO 102 with DIV 5 are inputted into PFD 3. PFD 3 compares phases of these two frequencies. The first conventional analog PLL circuit 100 stores electric charge in the capacitor Cm of the low-pass filter 101 according to the phase difference outputted from PFD 3. And the first conventional analog PLL circuit 100 controls voltage of VCO 102 based on the charge (voltage) stored in the capacitor Cm of the low-pass filter 101.

Then, the oscillation frequency outputted from VCO 102 via DIV 5 is locked in a target frequency using feedback loop. As described above, in the first conventional analog PLL circuit 100, the output pulse signal from PFD 3 is converted into analog control voltage low-pass filtered by the low-pass filter 101 of capacitor Cm. And using the analog control voltage, the first conventional analog PLL circuit 100 is configured to control the frequency of VCO 102.

As another analog PLL circuit, an analog PLL circuit 110 (denoted by second conventional analog PLL circuit in the following) as shown in FIG. 22, where corresponding units are indicated by the same reference signs with those of FIG. 21, is also known (for example, refer to Non Patent Literature 1 and 2). This second conventional analog PLL 110 includes a circuit 111 with PFD and a Charge Pump (denoted by PFD/CP in the following). In the second conventional analog PLL circuit 110, as in the first conventional analog PLL circuit 100 described above, the output pulse signal from PFD/CP 111 is converted into analog control voltage low-pass filtered by the low-pass filter 113 of capacitor Cm. And using the analog control voltage, the second conventional analog PLL circuit 110 is configured to control the frequency of VCO 102.

In addition to the first conventional analog PLL circuit 100 and the second conventional analog PLL circuit 110, another example of conventional technique is a digital PLL circuit 120 (denoted by conventional digital PLL circuit in the following), as shown in FIG. 23 is also known. In the conventional digital PLL circuit 120, a Time to Digital Converter 121 (denoted by TDC in the following) converts the pulse width of an output pulse signal into digital bits. The digital bit then goes through a Digital Filter 122 (denoted by DF in the following), which can output a digital bit to control the frequency of a Digital Controlled Oscillator 123 (denoted by DCO in the following) (for example, refer to Non Patent Literature 3 and 4).

CITATION LIST

Non Patent Literature

[Non Patent Literature 1]: Peter J. Lim, "An Area-Efficient PLL Architecture in 90-nm CMOS, "Symp. VLSI Circuits Dig. Tech. Papers, pp. 48-49, June, 2005.

[Non Patent Literature 2]: W.Y. Jung, et al., "A 1.2 mW 0.02 mm$^2$ 2 GHz Current-Controlled PLL Based on a Self-Biased Voltage-to-Current Converter," ISSCC Dig. Tech. Papers, pp. 310-311, February, 2007.

[Non Patent Literature 3]: K. Kim, et al., "A 5.4 mW 0.0035 mm$^2$ 0.48 ps$_{rms}$-Jitter 0.8-to-5 GHz Non-PLL/DLL All-Digital Phase Generator/Rotator in 45 nm SOI CMOS," ISSCC Dig. Tech. Papers, pp. 98-99, February, 2009.

[Non Patent Literature 4]: X. Gao, et al., "Spur-Reduction Technique for PLLs Using Sub-Sampling Phase Detection," ISSCC Dig. Tech. Papers, pp. 474-475, February, 2010.

SUMMARY OF INVENTION

Technical Problem

However, the first conventional analog PLL circuit 100 and the second conventional analog PLL circuit 110 requires the low-pass filter 101 and 113 of capacitor Cm to convert the output pulse signal outputted from PFD 3 and PFD/CP 111 into voltage corresponding to pulse width. Further, in order to synchronize the output pulse signal with reference clock frequency or to decrease reference spurious noise, it is necessary to prepare a large capacitor Cm. Then, the layout area of the capacitor Cm of the low-pass filter 101 and 113 becomes large, which prevents miniaturization.

In addition, while the price per unit area is rising in nanofabrication, it is difficult to reduce cost if the low-pass filter 101 or 113 of such a large capacitor Cm is required.

Further, in addition to the defect of the first conventional analog PLL circuit 100 and the second conventional analog PLL circuit 110 that the low-pass filter 101 and 113 of large capacitor Cm is required, there is the problem that fine adjustment of analog voltage is difficult due to low supply voltage.

As for the second conventional analog PLL circuit 110, the low-pass filter 113 of such a large capacitor Cm as several hundred pF can be required in order to stabilize the feedback loop. Thus, it is difficult to promote miniaturization and cost reduction.

On the other hand, as for the conventional digital PLL circuit 120, the low-pass filter of capacitor Cm which requires a large layout area is not necessary. Besides, fine adjustment of analog voltage is not necessary, either. Therefore, the conventional digital PLL circuit 120 is free from the drawbacks of the first conventional analog PLL circuit 100 and the second conventional analog PLL circuit 110.

However, the digital PLL circuit 120 has the characteristic problem that the transmittance between DF 122 and DCO 123 involves quantization noise because the number of bits of outputs from DF 122 is larger than the number of bits of inputs into DCO 123 and the outputs from DF 122 is dithered using a Delta Sigma Modulator 124 (denoted by DSM in the following). There occurs a large jitter in the digital PLL circuit 120, which prevents from decreasing quantization noise.

Further, such problems as miniaturization and reduction of quantization noise is a very important problem not only for a PLL circuit but also for a delay adjustment circuit like a DLL (Delay Locked Loop) circuit, or a phase control circuit which is a combination of a PLL circuit and a DLL circuit.

The present invention was produced under the problems described above. It is, therefore, an object of the present invention to suggest a signal conversion circuit, a PLL (Phase Locked Loop) circuit, a delay adjustment circuit, and a phase control circuit which can be miniaturized and quantization noise of which can be reduced.

Solution to Problem

As the solution to the problem described above, the first aspect in accordance with the present invention provides a signal conversion circuit for generating a signal according to an inputted pulse signal while receiving pulse width of the pulse signal, wherein the signal conversion circuit takes samples from the pulse signal, generates binary digital output values based on signal values taken as the samples, generates an analog intermediate output value only at a boundary where the digital output values transit, and generates a converted signal having the digital output values and the intermediate output value.

The second aspect in accordance with the present invention provides the signal conversion circuit of the first aspect, comprising a signal processing unit that prolongs time while the pulse signal falls from maximum to minimum or time while the pulse signal rises from minimum to maximum, and wherein the signal conversion circuit takes samples from the pulse signal with prolonged time while values of the pulse signal transits.

The third aspect in accordance with the present invention provides the signal conversion circuit of the second aspect, further comprising a pulse transition detection unit that detects a boundary where the pulse signal falls from maximum to minimum or a boundary where the pulse signal rises from minimum to maximum, wherein the signal conversion circuit takes samples from the pulse signal when detection result is obtained from the pulse transition detection unit.

The fourth aspect in accordance with the present invention provides the signal conversion circuit of the third aspect, further comprising a delay unit that delays the pulse signal, wherein delay time by the delay unit is larger than delay time caused by the pulse transition detection unit at detection of transition of the pulse signal.

The fifth aspect in accordance with the present invention provides the signal conversion circuit of the first aspect, wherein the pulse signal has a first pulse signal that indicates phase difference of two frequencies and a second pulse signal that indicates rising of later of the two frequencies, and wherein, while the converted signal is generated, the signal conversion circuit generates an analog variation based on difference width between a pulse width of the first pulse signal and a pulse width of the second pulse width and the signal conversion circuit shifts the intermediate output value by the analog variation.

The sixth aspect in accordance with the present invention provides a PLL circuit that compares phase of an input signal and phase of an output signal from an oscillation circuit to detect phase difference and generates an intended oscillation signal by controlling the oscillation circuit based on the phase difference, wherein the oscillation circuit generates the oscillation signal whose oscillation frequency is adjusted according to the converted signal outputted by the signal conversion circuit of any of the first through the fourth aspects.

The seventh aspect in accordance with the present invention provides a delay adjustment circuit that compares phase of an input signal and phase of a delayed output signal obtained via a pulse width controlled delay circuit to detect phase difference and generates an intended phase adjusted signal by controlling delay at the pulse width controlled delay circuit based on the phase difference, wherein the pulse width controlled delay circuit includes the signal conversion circuit of either of the first aspect or the fifth aspect, and wherein the pulse width controlled delay circuit generates the phase adjusted signal delayed according to the converted signal outputted from the signal conversion circuit.

The eighth aspect in accordance with the present invention provides the delay adjustment circuit of the seventh aspect, wherein an external input signal having a different frequency from that of the input signal is inputted into the signal conversion circuit, and wherein the signal conversion circuit delays the external input signal according to the converted signal generated based on phase difference between phase of the input signal and phase of the delayed output signal.

The ninth aspect in accordance with the present invention provides a phase control circuit comprising a PLL circuit that compares phase of an input signal and phase of an output signal from an oscillation circuit to detect phase difference and generates an intended oscillation signal by controlling the oscillation circuit based on the phase difference, and a delay adjustment circuit that compares phase of the input signal and phase of a delayed output signal obtained via a pulse width controlled delay circuit to detect phase difference and generates an intended phase adjusted signal by controlling, at the pulse width controlled delay circuit and based on the phase difference, delay of the oscillation signal outputted from the PLL circuit, wherein the pulse width controlled delay circuit includes a signal conversion circuit that takes samples from a pulse signal generated based on phase difference between the input signal and the delayed output signal, generates binary digital output values based on signal values taken as the samples, generates an analog intermediate output value only at a boundary where the digital output values transit, and generates a converted signal having the digital output values and the intermediate output value, and a control circuit that generates the phase adjusted signal by delaying the oscillation signal according to the converted signal.

The tenth aspect in accordance with the present invention provides the phase control circuit of the ninth aspect, wherein the PLL circuit generates the oscillation signal whose oscillation frequency is adjusted according to the converted signal outputted by the signal conversion circuit of any of the first through fourth aspects.

Advantageous Effects of Invention

According to the present invention, low-pass filters of large capacitance and large layout area conventionally required in order to convert pulse width into voltage are not required, which can lead to more miniaturization and reduced cost. Besides, an intermediate output value adequate for transitional state can be generated at a boundary where a pulse signal transits, which can realize less quantization noise.

BRIEF DESCRIPTION OF DRAWINGS

FIG. 4 shows graphs of a pulse signal and corresponding soft thermometer code.

FIG. 5 shows graphs of other pulse signals and corresponding soft thermometer codes.

FIG. 7 shows a graph indicating the relationship between pulse width and oscillation frequency and a graph indicating the relationship between pulse width and output voltage from each signal generation circuit.

FIG. 12 shows a block diagram of PLL circuit in FIG. 1 and a timing diagram indicating kinds of signals of the PLL circuit.

FIG. 18 shows a schematic diagram indicating a soft thermometer code generated by PWInteg and a circuit diagram indicating the configuration of STCDL.

REFERENCE SIGNS LIST

1 PLL circuit
4 PWCO
8 TSTC (signal conversion circuit)
9 STCO (oscillation circuit)
11 DLY (delay unit)
12 FED (pulse transition detection unit)
16 falling time control inverter (signal processing unit)
17 capacitor
19, 20 inverter (delay element)
50 phase control circuit
51, 75, 80 delay adjustment circuit
53 PWCDL (pulse width controlled delay circuit)
54 PWInteg (signal conversion circuit)
55 STCDL (control circuit)

DESCRIPTION OF EMBODIMENTS

The embodiments of the present invention are described in detail referring to figures in the following.

(1) Whole Configuration of PLL Circuit

Figure 1:
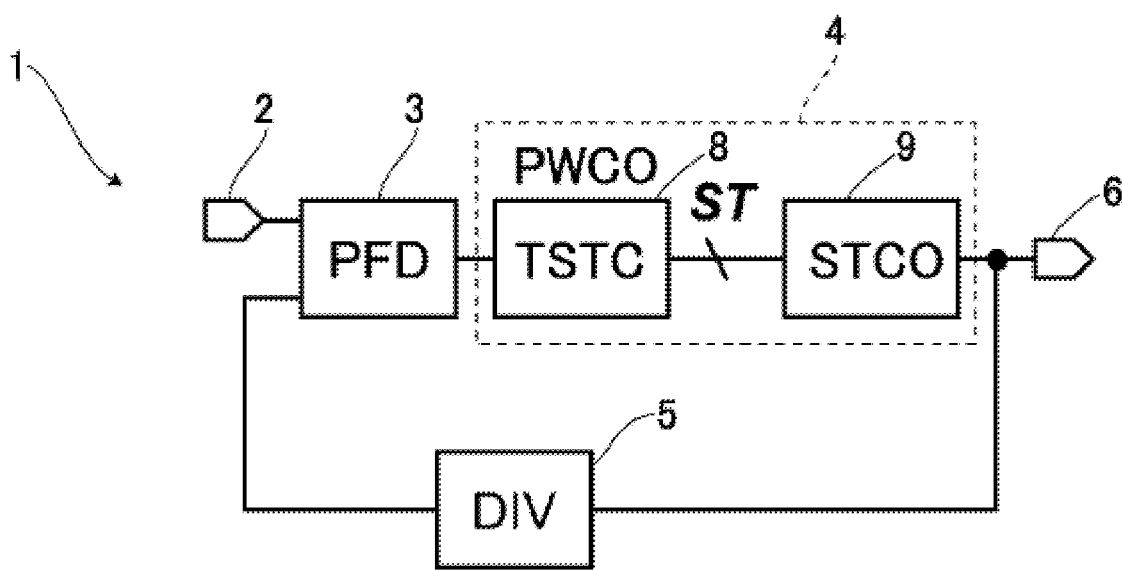
FIG. 1 shows a block diagram of a whole configuration of PLL circuit in accordance with the present invention.

In FIG. 1, the PLL circuit in accordance with the present invention is denoted by 1. The PLL circuit 1 includes PFD 3 into which an input signal with reference clock frequency is inputted from an input unit 2, a Pulse Width Controlled Oscillator 4 (denoted by PWCO in the following) whose oscillation frequency varies by the pulse width of phase difference output (pulse signal) inputted from PFD 3, and a DIV 5 that divides the oscillation frequency from the PWCO 4 and outputs to PFD 3. The PLL circuit 1 is configured to output an oscillation signal with an intended oscillation frequency controlled by PWCO 4 from an output unit 6.

Figure 21:
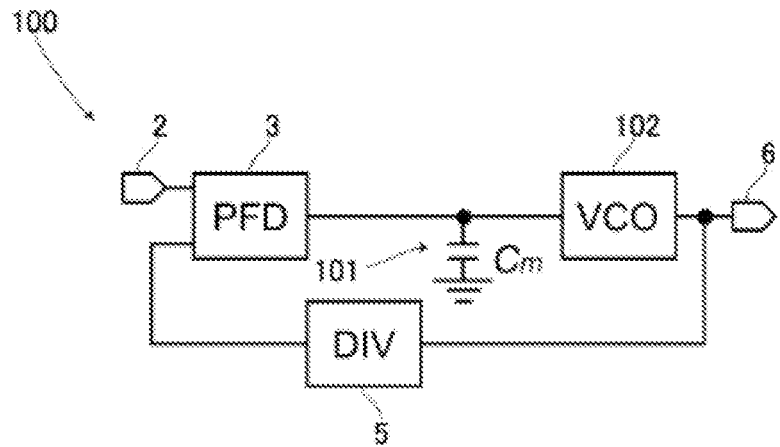
FIG. 21 shows a block diagram indicating a whole configuration of a first conventional analog PLL circuit.
Figure 22:
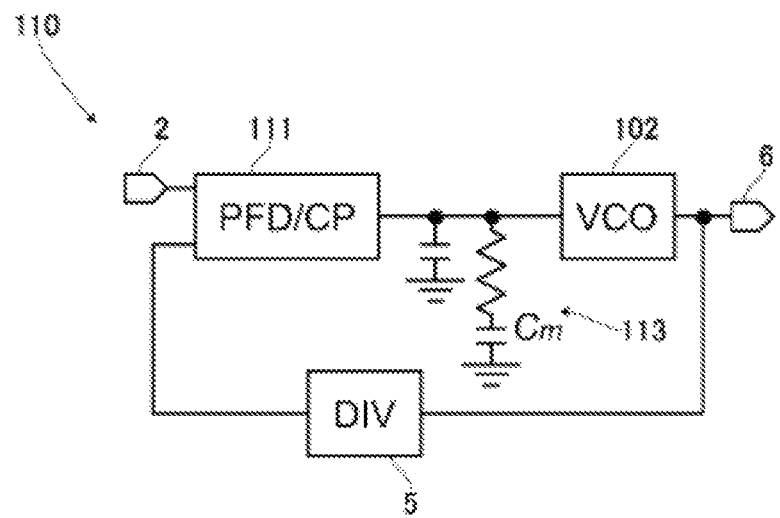
FIG. 22 shows a block diagram indicating a whole configuration of a second conventional analog PLL circuit.

The PLL circuit 1 in accordance with the present invention includes the PCWO 4, so the conventional analog control of voltage-domain, which prevents from promoting miniaturization, is not required. Thus, in the PLL circuit 1, the low-pass filter 101 or 113 (FIG. 21 or 22) of capacitor Cm which was required for converting pulse width into voltage and which is large in layout area is not required, which means that miniaturization and cost reduction are possible.

Concretely, in the PLL circuit 1, when a pulse signal which is phase difference output of a predetermined pulse width outputted from the PFD 3, the PWCO 4 converts the pulse signal into binary digital values of voltage 0 (denoted simply by 0 in the following) or voltage $V_{DD}$ (denoted by 1 in the following) according to the signal value of the pulse signal, excepting at boundaries where the pulse signal rise or fall. Then, the pulse width of the pulse signal can be expressed by 0 and 1.

Additionally, the PLL circuit 1 in accordance with the present invention converts the pulse signal not only into simply either 0 or 1 but also into analog voltage which ranges from 0 to 1 according to the signal values of the pulse signal only at the boundaries of 0 and 1, which can suppresses the occurrence of quantization noise involved with digitalization. Here, analog voltage means an arbitrary intermediate value which ranges between digitally binary 0 and 1 such as 0.3, 0.4, 0.5 or the like. The analog voltage varies according to the signal value of the pulse signal. Thus, only the boundary where the pulse signal rises or falls can be expressed intermediate analog voltage in the PWCO 4. The example of the intermediate analog voltage is 0.4 not 0 or 1 in "1, 1, 1, 0.4, 0, 0 . . . 0."

Here, a code which includes the sequence of 1 and the sequence of 0 such as " . . . 1, 1, 0, 0 . . . " and which indicates the size of pulse width or the like by the boundaries of 0 and 1 is called a thermometer code. As for the present invention, the changing points between 0 and 1 are expressed by analog voltages. Hereafter, the thermometer code with analog voltage only at the changing points of pulse signals as this is denoted by a soft thermometer code.

As described above, the PLL circuit 1 in accordance with the present invention can express the time-domain of a pulse signal by digital values and minimum analog voltage, on the promise of expressing the signal values of the pulse signal by 0 and 1, by converting only the boundaries where the pulse signal rises or falls into analog voltages which ranges between 0 and 1. Therefore, a circuit configuration free from quantization noise can be realized.

Concretely, the PWCO 4 includes a Time to Soft Thermometer code Converter 8 (denoted by TSTC in the following) and a Soft Thermometer code Controlled Oscillator 9 (denoted by STCO in the following). The PWCO 4 is configured to generate a soft thermometer code at the TSTC 8 and generate an intended oscillation frequency at the STCO 9 based on the soft thermometer code generated by the TSTC 8.

The TSTC 8 is configured to detect the changing point where the pulse signal inputted from PFD 3 at maximum state falls. At this time, the TSTC 8 is configured to take signal values of 1 cycle as samples from the pulse signal and hold the sample values. Then, the TSTC 8 is configured to convert the maximum of the pulse signal into 0, the minimum of the pulse into 1 and the changing point where the pulse signal at minimum state rises into an analog voltage according to the change, generate a soft thermometer code including them, and input the thermometer code into the STCO 9.

The STCO 9 is a ring oscillator which includes the odd number of inverters connected to form a ring. The STCO 9 controls the oscillation frequency based on the input of the soft thermometer code from the TSTC 8. In the STCO 9, load is put on the inverters according to the number of 1 in the soft thermometer code inputted from the TSTC 8. Also, load is put on the inverters in an analog way according to the value of analog voltage at the changing point between 0 and 1. Thus, the STCO 9 is configured to generate the oscillation frequency corresponding to the amplitude of the load.

Concretely, the STCO 9 is constituted so that, when the pulse signal with wide pulse width is inputted from the PFD 3 into the TSTC 8, a soft thermometer code with less 1s and more 0s are inputted from the TSTC 8, less load is put on the inverters due to the increase of the number of 0s, and the higher oscillation frequency is generated. On the other hand, the STCO 9 is constituted so that, when the pulse signal with narrow pulse width is inputted from the PFD 3 into the TSTC 8, a soft thermometer code with more 1s and less 0s are inputted from the TSTC 8, contrary to the case above, more load is put on the inverters due to the increase of the number of is, and the lower oscillation frequency is generated.

Besides, the STCO 9 is constituted so that the load of an analog value is put according to the analog voltage indicating the changing point between 0 and 1 in a soft thermometer code, and the lower oscillation frequency is generated.

The DIV 5 connected to the output side of the PWCO 4 is configured to divide the oscillation frequency outputted from the PWCO 4 and output the divided frequency to the PFD 3. Therefore, the PLL circuit 1 is configured to compare, using the PFD 3, the phase of an input signal with the reference clock frequency inputted from the input unit 2 and the phase of an output signal with the oscillation frequency inputted DIV 5, output again the pulse signal corresponding to the phase difference output to the PWCO 4, repeat these processes, and output the oscillation signal with the optimally adjusted oscillation frequency from the output unit 6.

(2) Circuit Configuration of PWCO

Figure 2:
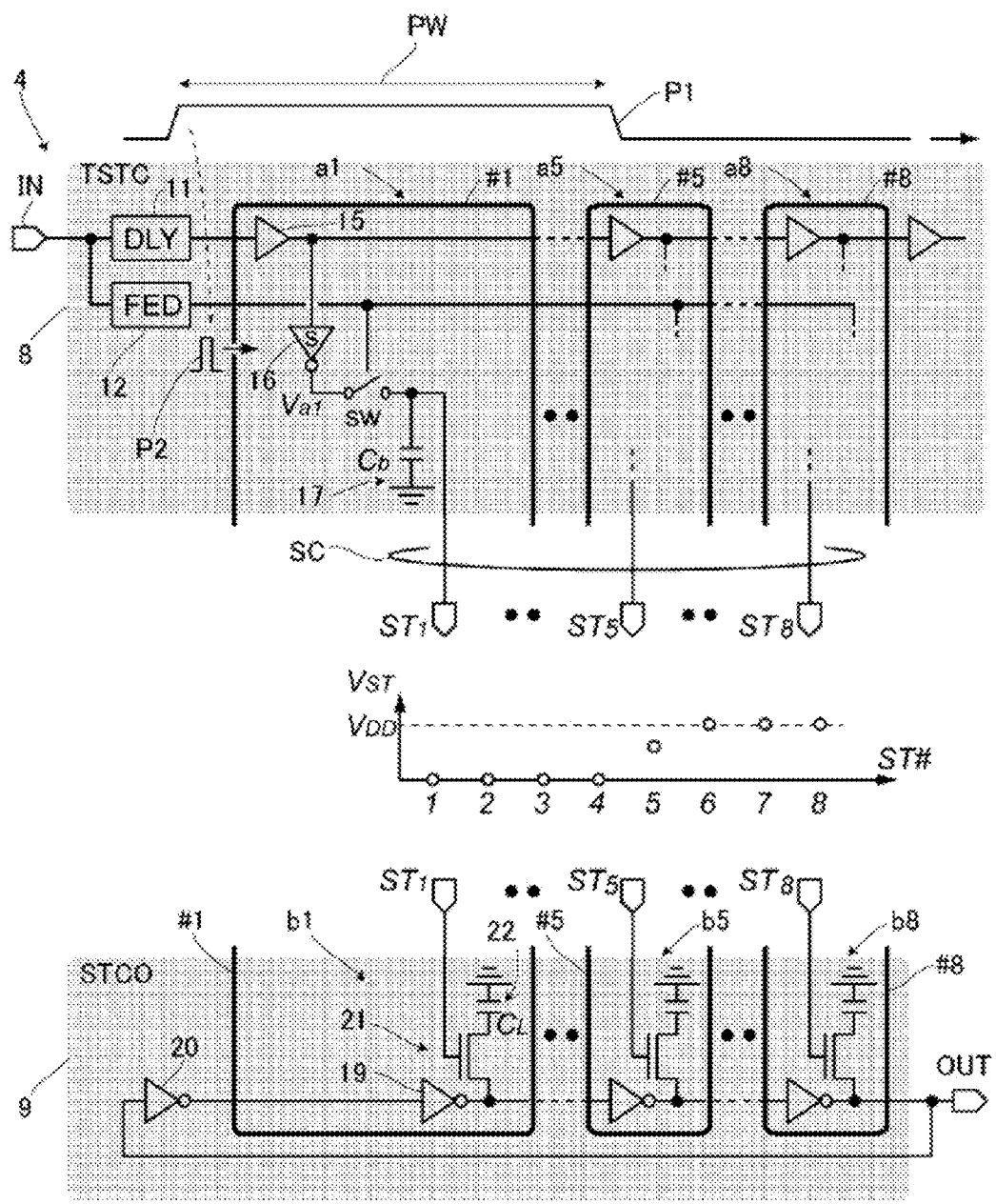
FIG. 2 shows a specific circuit diagram of PWCO.

Next, the PWCO 4 is described in detail. FIG. 2 shows a specific circuit diagram of the PWCO 4, indicating that the TSTC 8 and the STCO 9 are connected by lines ST1 . . . , ST8. In FIG. 2, a graph is also shown, indicating which signal generation circuit a1 . . . , and a8 of the TSTC 8 outputs what binary digital output values denoted by 0 or 1, or analog voltage other than 0 or 1.

First, the TSTC 8 is described. The TSTC 8 includes a delay circuit 11 (denoted by DLY in the following), a Falling Edge Detector 12 (denoted by FED in the following), and a plurality of stages #1 . . . , and #8 of signal generation circuits a1, . . . , and a8.

Here, each of the plurality of stages #1 . . . , and #8 of signal generation circuits a1 . . . , and a8 has the same circuit configuration. In FIG. 2, only the first stage #1, the fifth stage #5 and the eighth stage #8 of the signal generation circuits a1, a5 and a8 are shown for simplicity. Besides, in FIG. 2, the specific configuration of only the first stage #1 of the signal generation circuit a1 is shown and the detail of the other signal generation circuits a5 and a8 are not shown for simplicity. So, in the following, the description of the signal generation circuits is focused on the first stage #1 of the signal generation circuit a1.

First, in the TSTC 8, the pulse signal P1 from the input IN is configured to be inputted into the DLY 11 and the FED 12. The DLY is connected to each of the stages #1 . . . , and #8 of the signal generation circuits a1 . . . , and a8. After delaying the pulse signal P1 inputted from the input IN, the DLY 11 is configured to output the delayed pulse signal P1 to each of the signal generation circuits a1 . . . , and a8. Here, as shown in the row of "IN" in FIG. 3, the waveform at minimum rises at IN at a predetermined timing, and the pulse signal P1 with a pulse width, which is indicated by the width of the wave at maximum, can be inputted into the DLY 11 periodically.

The FED 12 (refer to FIG. 2) connected to the input IN as with the DLY 11 is configured to detect the falling of the pulse signal P1. And as shown in the rows "IN" and "FED" in FIG. 3, when the FED 12 detects the falling of the pulse signal P1, in response, the FED 12 is configured to generate a detection signal P2 which rises and falls instantly. The FED 12 is configured to output the detection signal P2 to each of the stages #1, . . . , and #8 of the signal generation circuits a1, . . . , and a8. The FED 12 is configured to hold voltage corresponding to the pulse signal P1 at each of the signal generation circuits a1, . . . , and a8 based on the detection signal P2.

Here, each of the signal generation circuits a1, . . . , and a8 has buffer 15. The input of the buffer 15 of the latter signal generation circuit a2, for example, is connected to the output of the buffer 15 of the former signal generation circuit a1. Similarly, the input of the buffer 15 of the latter signal generation circuit a3 is connected to the output of the buffer 15 of the former signal generation circuit a2. The buffers 15 are connected in the order of the stages like the first stage #1, . . . , and the eighth stage #8.

In the signal generation circuit a1, a falling edge controlled inverter 16 and a capacitor 17 of capacitance Cb configures a low-pass filter. The input of the falling edge controlled inverter is connected to the output of the buffer 15 connected to the DLY 11. The signal generation circuit a1 has a switch SW between the falling edge controlled inverter 16 and the capacitor 17. And the output of the FED 12 is connected to the switch SW. When the detection signal from the FED 12 is inputted into the switch SW, the switch SW goes on and off instantly, which connects the falling edge controlled inverter 16 and the capacitor 17 for a while.

Figure 3:
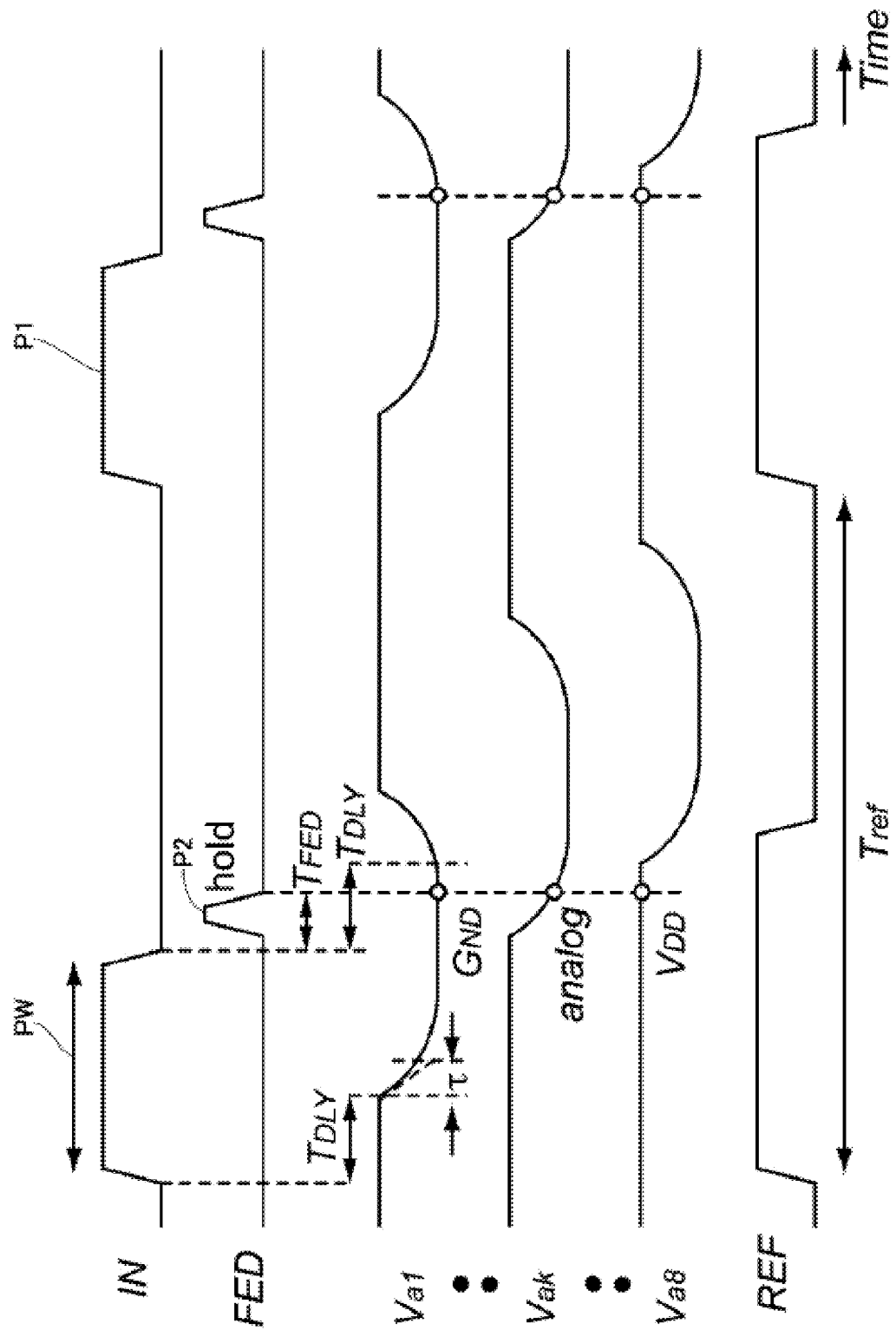
FIG. 3 shows a timing diagram of PWCO.

Here, the falling edge controlled inverter 16 of the signal generation circuit a1 is configured, as shown in the row of "Va1" in FIG. 3, not only to invert the inputted pulse signal but also to prolong the span the inverted pulse signal falls, thereby generate the waveform which has a gentle falling point. Here, the time constant τ for generating the waveform with a gentle falling point plays an important role in order to generate analog voltage at the boundary between 1 and 0 in the soft thermometer code. The falling edge controlled inverter 16 is configured to control the time constant τ.

The time constant τ is small enough compared with the time constants of low-pass filters 101 and 113 in the first conventional analog PLL circuit 100 and the second conventional analog PLL circuit 110. Thus, the capacitance Cb of the capacitor 17 can be realized by the MOS gate capacitance composed of several transistors of common size in parallel.

In the TSTC 8, the switch SW of each of the signal generation circuits a1, ..., and a8 goes on and off based on the detection signal from the FED 12, thereby the voltage of the delayed pulse signal at each stage of the signal generation circuits a1, ..., and a8 can be stored and held in the capacitor 17. Here, as shown in FIG. 3, the delay time at the DLY 11, $T_{DLY}$, is designed as longer than the delay time at the FED 12, $T_{FED}$. Thus, Va1 outputted from the falling edge controlled inverter 16 of the first signal generation circuit a1 is always 0. Further, the outputs V1, ... and V4 outputted from the falling edge controlled inverters 16 of the first stage #1, ..., and the fourth stage #4 of the signal generation circuits a1, ..., and a4, for example, which are positioned within the pulse width PW of the pulse signal P1 become 0.

On the other hand, Va6, Va7 and Va8 outputted from the falling edge controlled inverters 16 of the sixth stage #6, the seventh stage #7 and the eighth stage #8 of the signal generation circuits a6, a7 and a8, which are positioned corresponding to minimum not within the pulse width PW of the pulse signal P1 become 1. Additionally, Va5 outputted from the falling edge controlled inverters 16 of the fifth stage #5 of the signal generation circuit a5, which is positioned at the changing point of the pulse signal P1 becomes an intermediate analog voltage.

As a result, the TSTC 8 is configured to generate a soft thermometer code based on the time-domain pulse signal P1 as shown in the middle in FIG. 2, for example, with outputs 0s from the first stage through the fourth stage #4, outputs 1s ($V_{DD}$) after the sixth stage #6, and an output of an intermediate analog voltage at the boundary, the fifth stage #5.

As this, the soft thermometer code SC generated at the TSTC 8 can be output to the STCO 9. As shown in FIG. 2, the line ST1 of the first stage #1 of the signal generation circuit a1 of the TSTC 8 is connected to the line ST1 of the first stage #1 of the load control circuit b1 of the STCO 9. The line ST2 of the second stage #2 of the signal generation circuit a2 of the TSTC 8 is connected to the line ST2 of the second stage #2 of the load control circuit b2 of the STCO 9. Similarly, the lines ST1, ..., ST8 of the first stage #1, ..., the eighth stage #8 of the signal generation circuits a1, ..., a8 of the TSTC 8 is connected to the lines ST1 of the first stage #1, ..., the eighth stage #8 of the load control circuits b1, ..., b8, respectively. Here, because each the load control circuits b1, ..., b8 has the same circuit structure, only the first stage #1, the fifth stage #5 and the eighth stage #8 of the load control circuits b1, b5 and b8 are shown in FIG. 2 for simplicity.

Here, the STCO 9 includes an inverter 19 in each of the load control circuits b1 ..., b8 and another inverter 20. These odd number of inverters 19 and 20 are connected in a ring to form a ring oscillator. This ring oscillator is configured so that the input signal is inverted at each of the inverters 19 and 20. Thus, by making input signal go through the odd number of inverters 19 and 20 serially connected in a ring, if an output signal in high level at OUT, for example, is fed back to the inverter 20 at the first stage, a next output signal in low level can be gained at OUT. So, the ring oscillator is configured to function as an oscillator by making an output signal go rounds. The oscillation frequency of this ring oscillator is determined by delay values based on the load capacitance of each of the inverters 19 and 20. In particular, the load capacities of the inverters 19 are individually controlled by each of the load control circuits b1 ..., b8.

Concretely, the load control circuit b1 includes an NMOS (N-channel Metal Oxide Semiconductor) transistor 21. The gate of the NMOS transistor 21 is connected to the capacitor 17 of the signal generation circuit a1. The drain of the NMOS transistor 21 is connected to a capacitor 22, which is the load capacitance of the inverter 19. The source of the NMOS transistor 21 is connected to the ring oscillator.

So, the load control circuit b1 is configured such that the NMOS transistor 21 of the load control circuit b1 becomes OFF if the output from the signal generation circuit a1 connected to the gate of the NMOS transistor 21 is 0. Then, as for the load control circuit b1, the capacitor 22 connected to the drain does not function as the load capacitance on the inverter 19. Thus, the oscillation frequency of the ring oscillator becomes the higher and high frequency can be output.

On the other hand, the load control circuit b1 is configured such that the NMOS transistor 21 of the load control circuit b1 becomes ON if the output from the signal generation circuit a1 connected to the gate of the NMOS transistor 21 is 1. Then, as for the load control circuit b1, the capacitor 22 connected to the drain functions as the load capacitance on the inverter 19. Thus, the oscillation frequency of the ring oscillator becomes the lower and low frequency can be output.

Additionally, the load control circuit b1 is configured such that the NMOS transistor 21 of the load control circuit b1 becomes ON if analog output (analog voltage) other than 0 or 1 from the signal generation circuit a1 is given to the gate. Then, analog load capacitance is put on the inverter 19 from the capacitor 22 corresponding to the analog output value. Thus, the oscillation frequency of the ring oscillator becomes the lower. For example, if an intermediate analog output value between 0 and 1 of '0.4' is given to the gate of the NMOS transistor 21 from the signal generation circuit a1, the NMOS transistor 21 becomes ON and the analog load capacitance corresponding to this '0.4' can be given to the inverter 19 from the capacitor 22.

By the configuration described above, if the pulse width PW of the pulse signal P1 which is the output $V_{PFD}$ from the PFD 3 is narrow, as shown in FIG. 4A, an soft thermometer code SC is, as shown in FIG. 4B as an example, composed of one 0 of the output Va1 from the first stage #1 of the signal generation circuit a1, 1s of the outputs Va3, ..., Va8 of the third stage #3 and latter of signal generation circuits a3, ..., a8, and an analog voltage of the output Va2 of the second stage #2 of the signal generation circuit a2 at the changing point from the pulse width. The soft thermometer code SC is output to the corresponding stages of the load control circuit b1 ..., b8. And the STCO 9 is configured to generate the oscillation frequency based on the soft thermometer code SC.

Next, if the pulse width PW of the pulse signal P1 which is the output $V_{PPG}$ from the PFD 3 is middle in width, as shown in FIG. 5A, an soft thermometer code SC is, in response to the pulse width PW as shown in FIG. 5B as an example, composed of 0s of the outputs Va1, Va2 and Va3 from the first, second and third stages #1, #2 and #3 of the signal generation circuits a1, a2 and a3, an analog voltage of the output Va4 of the fourth stage #4 of the signal generation circuit a4 at the changing point from the pulse width and is of the outputs Va5, ..., Va8 of the fifth stage #5 and latter of signal generation circuits a5, ..., a8. The soft thermometer code SC is output to the corresponding stages of the load control circuit b1 ..., b8. And the STCO 9 is configured to generate the oscillation frequency based on the soft thermometer code SC.

In addition, if the pulse width PW of the pulse signal P1 which is the output $V_{PFD}$ from the PFD 3 is wide, as shown in FIG. 5C, an soft thermometer code SC is, in response to the pulse width PW as shown in FIG. 5D as an example, composed of 0s of the outputs Va1, . . . , Va6 from the first through sixth stages #1, . . . , #6 of the signal generation circuits a1, . . . , a6, an analog voltage of the output Va7 of the seventh stage #7 of the signal generation circuit a7 at the changing point from the pulse width and one 1 of the outputs Va8 of the eighth stage #8 of signal generation circuits a8. The soft thermometer code SC is output to the corresponding stages of the load control circuit b1 . . . , b8. And the STCO 9 is configured to generate the oscillation frequency based on the soft thermometer code SC. As this, the STCO 9 is configured such that, as shown in FIG. 6, the wider the pulse width PW of the pulse signal P1 inputted from the PFD 3 to the TSTC 8 is, the more the number of 0 in the soft thermometer code SC and the higher oscillation frequency is generated.

Figure 6:
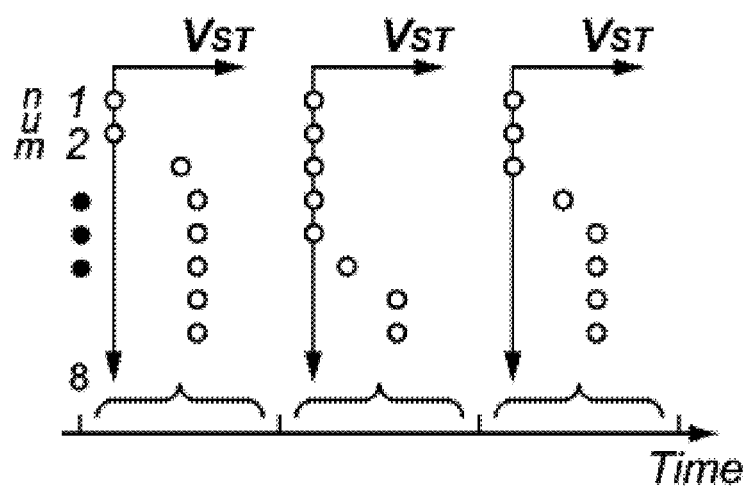
FIG. 6 shows thermometer codes generated based on periodic pulse signals.

The PWCO 4 is configured to generate a soft thermometer code SC composed of 0, 1, and an analog voltage, as shown in FIG. 6, from the first . . . , the eighth of the signal generation circuits a1, . . . , a8 at the TSTC 8. Based on the soft thermometer code SC, the PWCO 4 is configured to generate an oscillation frequency (an oscillation frequency $T_{ref}$, for example, as shown in the bottom row of "REF" in FIG. 3) at the STCO 9.

(3) Timing Constraints

As shown in FIG. 7B, in the delay process by the falling edge controlled inverter 16 at the signal generation circuits a1, . . . , a8, it is necessary to overlap the slope region by the delay at a former stage i and the slope region by the delay at a latter stage i+1 in order to realize the pulse width for smooth soft thermometer conversion. Therefore, the time constant τ should not be too small or too large, compared with the delay at the first stage of the signal generation circuit a1.

The delay time $T_{DLY}$ at the DLY 11 is designed as larger than the delay time $T_{FED}$ at the FED 12 in order to guarantee that the output Va1 at the first stage (the signal generation circuit a1) should be sampled and held in 0 before rising (refer to FIG. 3). Another timing constraint is that the pulse width of the inputted pulse signal should be larger than the delay at the DLY 11 and smaller than the delay at the last eighth stage of the signal generation circuits a1 . . . , a8. Besides, the delay at the last eighth stage of the signal generation circuits a1, . . . , a8 should be smaller than the reference clock period to complete the soft thermometer conversion before the next inputted pulse signal comes at the rising edge of the reference clock. These constraints are expressed as "$T_{FED} < T_{DLY}$<pulse width<the delay at the eighth stage<reference clock period."

(4) Behavior and Effect

With the configuration described above, the TSTC 8 generates a soft thermometer code SC according to the inputted pulse signal P1 while receiving the pulse width PW of the pulse signal P1. That is, the TSTC 8 is configured to take a sample from the pulse signal P1 as time passes, to convert the signal values of the pulse signal P1 taken as the samples into binary digital output values, 0 or 1, to convert the pulse signal P1 into analog transition only at the boundary where the pulse signal P1 transits, to take a sample from the boundary and convert it into an analog voltage, and to generate a soft thermometer code SC, composed of 0s, 1s and analog voltage (intermediate output value).

Figure 23:
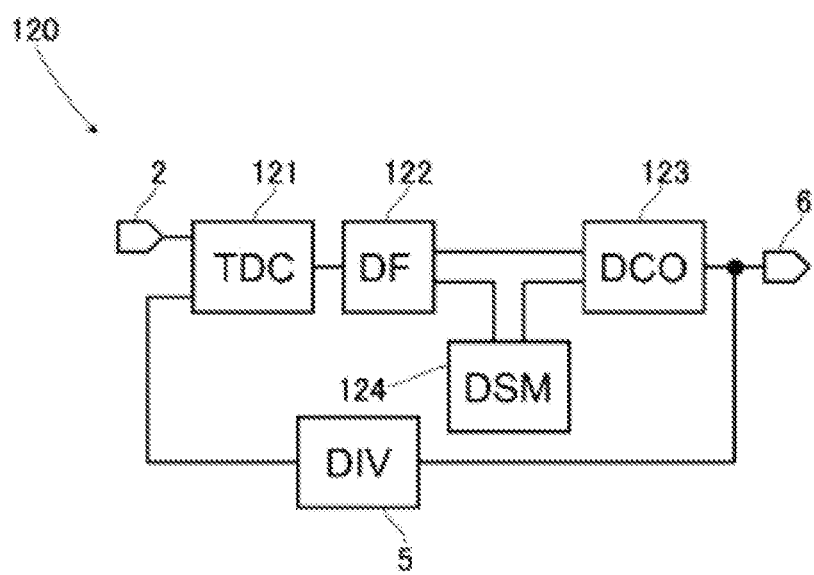
FIG. 23 shows a block diagram indicating a whole configuration of a conventional digital PLL circuit.

As a result, the TSTC 8 does not need the low-pass filter 101 or 113 (refer to FIG. 21 or 22) of capacitor Cm with large layout area, which was conventionally required in order to convert the pulse width into voltage. Thus, it is possible, with the TSTC 8, to promote miniaturization and cost reduction. Besides, because the TSTC makes it possible to generate analog voltage suitable for the transition state at the boundary where the pulse signal P1 transits, quantization noise can be reduced than conventional digital PLL circuit 120 (refer to FIG. 23).

In addition, the TSTC 8 includes the falling edge controlled inverter 16 which inverts the pulse signal P1 and prolong its falling time. The pulse signal P1 is sampled as time passes after the falling time of the pulse signal P1 was prolonged by the falling edge controlled inverter 16. Such a configuration of the TSTC 8 makes it possible to generate a soft thermometer code SC as a converted signal.

Further, the TSTC 8 is configured to detect the falling edge of the pulse signal P1 from maximum by the FED 12. And at this timing, the pulse signal P1 delayed at the falling edge controlled inverter 16 is sampled. Such a configuration of the TSTC 8 makes it possible to generate the soft thermometer code SC based on the pulse signal P1 with changing points of the pulse width PW as time passes.

The TSTC 8 makes up a part of the PLL circuit 1 by connected to the STCO 9 which controls the delay amount according to the generated soft thermometer code and which includes odd numbers of inverters 19 and 20 to form a ring. In the PLL circuit 1, the PFD 3 compares the reference clock frequency inputted from the input unit 2 and the oscillation frequency (output frequency) from the STCO 9 to detect the phase difference and generate a pulse signal. The TSTC 8 generates a soft thermometer code SC based on the pulse signal. The PLL circuit 1 can generate an intended oscillation frequency at the STCO 9 based on the soft thermometer code SC.

(5) Another Embodiment

Figure 8:
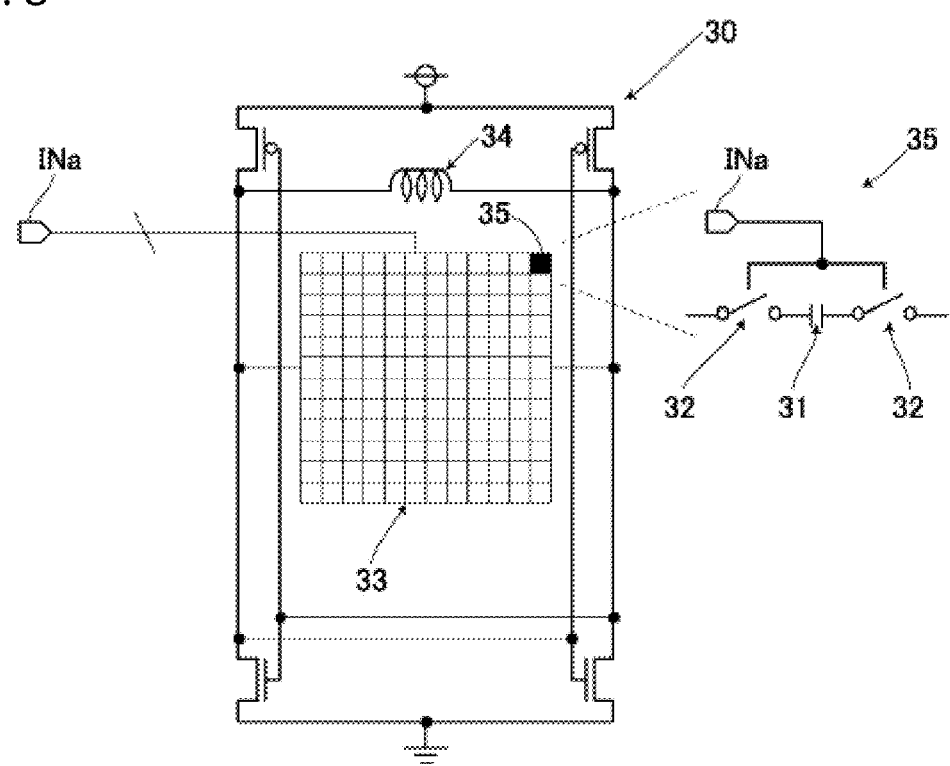
FIG. 8 shows a circuit diagram indicating the configuration of an LC oscillator in accordance with another embodiment.

The present invention is not restricted by the embodiment described above. The present invention may be embodied by kinds of variations of embodiments within the gist of the present invention. For example, the LC oscillator 30 as shown in FIG. 8 may be connected to the TSTC 8 in place of the STCO 9 shown in FIG. 2. Here, the LC oscillator 30 shown in FIG. 8 has the same circuit configuration with the DCO 123 used in the conventional digital PLL circuit 120 (refer to FIG. 23). The output of the signal generation circuits a1 . . . , a8 of the TSTC 8 shown in FIG. 2 may be connected to the input INa.

Here, the LC oscillator 30 includes a group of capacitors 33 and a coil 34 connected in parallel. The group of capacitors 33 has capacitors 31 connected in parallel one another and switches 32 which change the connection relationship between the capacitors 31. The connection relationship of capacitor 31 changes by the switch 32 when digital outputs 0 and 1 and analog voltage at the boundary is given as a soft thermometer code from the signal generation circuits a1 . . . , a8.

Thus, the capacitances of the group of capacitors 33 change according to the soft thermometer code. And the change of the capacitances controls the oscillation frequency. Here, the LC oscillator 30 has a capacitor 31 and two switches 32 per block 35, for example. However, the specific configuration of all of the blocks 35 was not illustrated in detail for simplicity. The capacitor 31 and switches 32 of only one of the blocks 35 are illustrated.

By using the LC oscillator 30 described above, too, when analog voltage is applied from any of the signal generation circuits a1 . . . , a8 of the TSTC 8, the capacitance of capacitor 31 is adjusted according to the analog voltage, and optimally controlled oscillation frequency can be generated.

Figure 9:
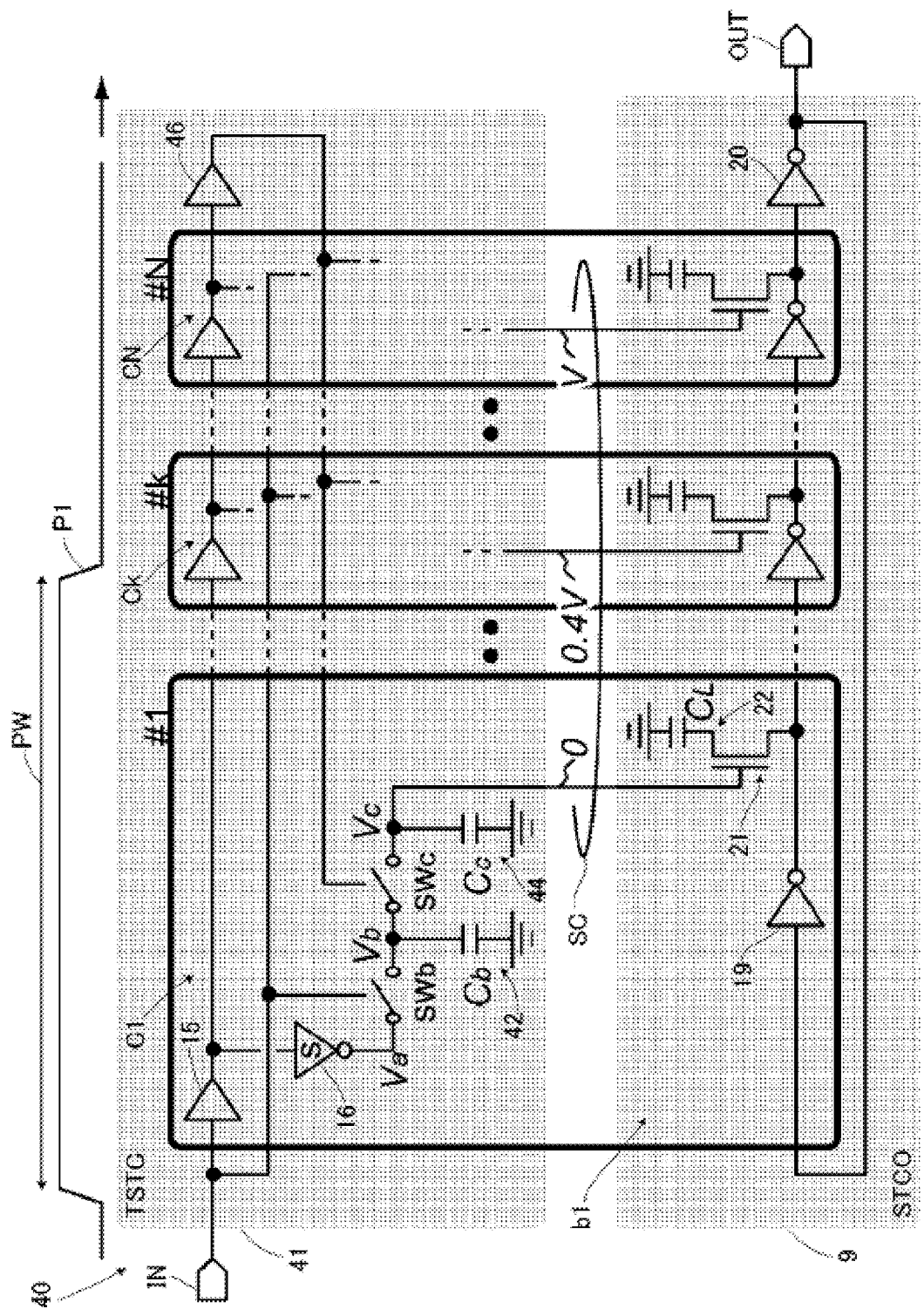
FIG. 9 shows a circuit diagram indicating the specific configuration of PWCO in accordance with another embodiment.

In addition, the PWCO 4 with the TSTC 8 as shown in FIG. 2 is described above. The present invention may be embodied by using a PWCO 40 with a TSTC 41 as shown in FIG. 9. Here, the PWCO 40 in FIG. 9 has TSTC 41 different from the TSTC of the PWCO 4 in FIG. 2. The TSTC 41 does not need the FED.

Concretely, the TSTC 41 includes the first stage #1 . . . , the Nth stage #N of signal generation circuits C1 . . . , CN which are configured to be inputted with the pulse signal P1 from an input IN. Here, all the signal generation circuits C1 . . . , CN have the same configuration. Thus, the first stage #1 of the signal generation circuit C1 is mainly described in the following.

In the signal generation circuit C1, an input IN is connected to the buffer 15 and a switch SWb. The output of the buffer 15 is connected to the falling edge controlled inverter 16 and the buffer 15 of the next stage of a signal generation circuit C2. The falling edge controlled inverter 16 is connected to the switch SWb and a switch SWc in this order. The output of the switch SWc is connected to a capacitor 44 of capacitance Cc and the load control circuit b1 of the STCO 9. A capacitor 42 of capacitance Cb is connected between the switch SWb. And the switch SWc is connected to the output of a group of the buffers 15 of C1, the buffer of every stage of signal generation circuits C2 . . . , CN, and a buffer 46, serially connected in this order.

In the signal generation circuit, when the pulse signal P1 is inputted from the PFD 3 via the input IN, the switch SWb turns ON all the while the pulse signal P1 is at maximum, and the falling edge controlled inverter 16 and the capacitor 42 are connected.

Then, in the signal generation circuit C1, the pulse signal P1 inputted from the input IN is inverted at the falling edge controlled inverter 16 as well as the falling time is controlled. The voltage of the pulse signal P1 after inversion and control of rising time is always stored in the capacitor 42. Here, the falling edge controlled inverter 16 inverts such a pulse signal as shown in the row of "IN" in FIG. 10 and prolongs the falling time of the inverted pulse signal, thereby generating the waveform smoothly falling at the changing point of the signal value of the pulse signal P1, as shown in the row of "Va1" in FIG. 10.

Next, in the signal generation circuit C1, when the pulse signal P1 inputted from the input IN falls, the switch SWb goes OFF instantly. The signal value of the pulse signal P1 stored in the capacitor 42 is held. Then, the latter switch SWc goes ON and now the voltage at the capacitor 42 is stored and held in the latter capacitor 44.

In this embodiment, as well as the embodiment previously described, the output Va1 from the falling edge controlled inverter 16 of the first stage of the signal generation circuit C1 is always 0. And the outputs from the falling edge controlled inverters 16 of the signal generation circuits C1, . . . , C(k−1), for example, which are positioned within the pulse width PW of the pulse signal P1, Va1, . . . , Va(k−1), are 0. Here, k−1 is a value according to the pulse width PW of the inputted pulse signal P1.

The outputs Va(k+1) . . . , VaN outputted from the falling edge controlled inverter 16 of the signal generation circuits C(k+1), . . . , CN which are positioned at minimum without the pulse width PW of the pulse signal P1 are 1. In addition, the output Vak outputted from the falling edge controlled inverter 16 of the signal generation circuit Ck which is positioned at the changing point of the pulse signal P1 is an intermediate analog voltage between 0 and 1.

Thus, in this embodiment, too, the TSTC 41 is configured to generate a soft thermometer code SC, based on the pulse signal in the time axis direction, with 0s outputted from between the first stage and the k−1 stage, 1s (denoted by voltage V in FIG. 10) outputted from the k+1 stage and after, and Vak as intermediate analog voltage (0.4 in FIG. 10) outputted from the k stage at the boundary, as shown in the middle rows of "Va1," . . . "Vak," . . . , and "VaN" in FIG. 10.

Figure 10:
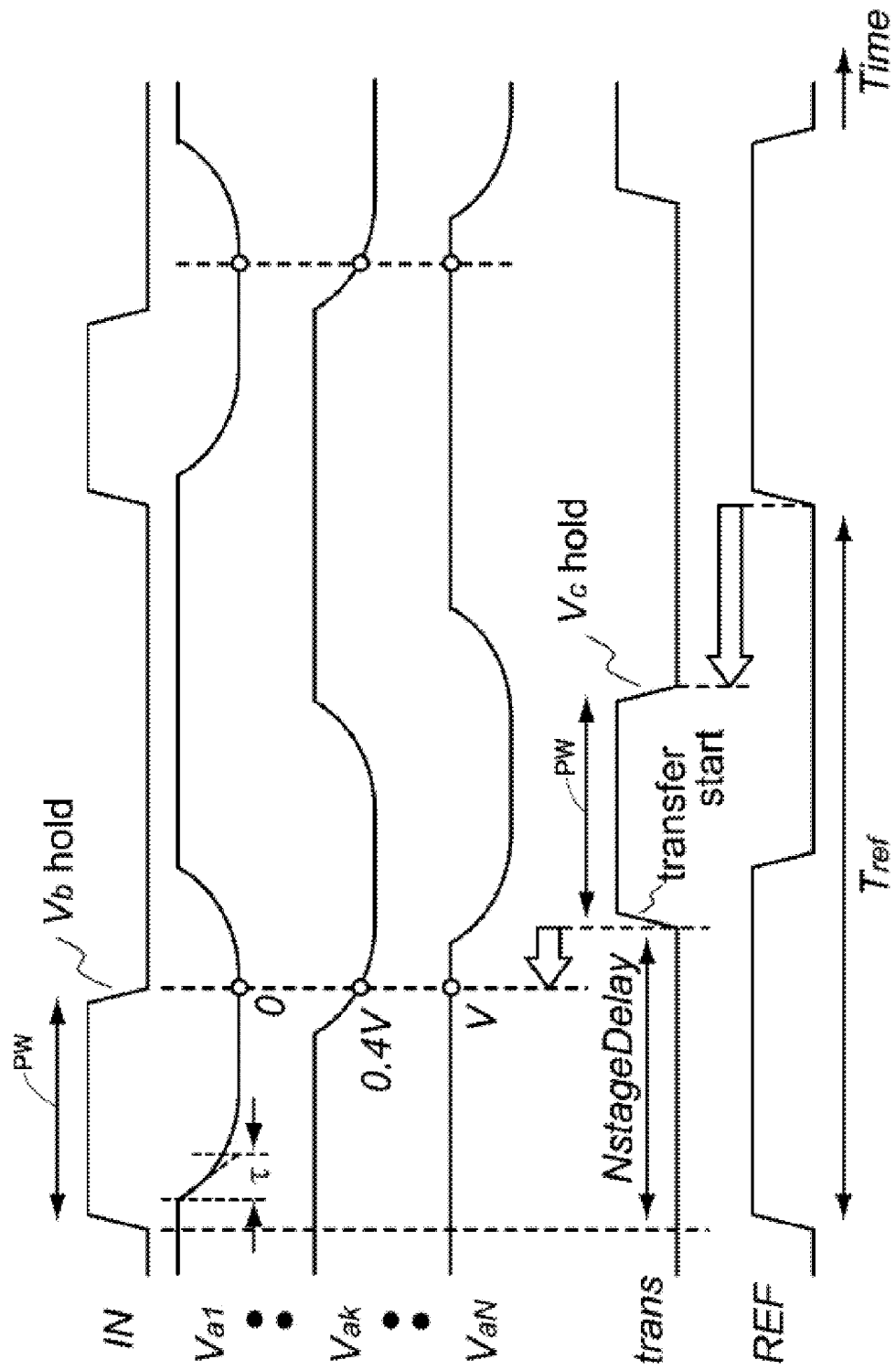
FIG. 10 shows a timing diagram of PWCO in accordance with another embodiment.

Here, the waveform of the pulse signal P1 outputted from the buffer 46 after going through each of the first stage #1 . . . , and the N stage #N is shown in the row of "trans" in FIG. 10. After going through the buffers 15 and 46, the waveform may be delayed by a particular time (denoted by "NstageDelay" in FIG. 10) from the pulse signal P1 of input IN. At the moment the waveform of "trans" starts to rise, the switch SWc goes ON and the voltage of the capacitor 42 is stored and held in the capacitor 44 of the next stage. Therefore, the TSTC 41 in accordance with this embodiment is configured to generate a soft thermometer code SC and to output the soft thermometer code SC to the STCO 9.

Figure 11:
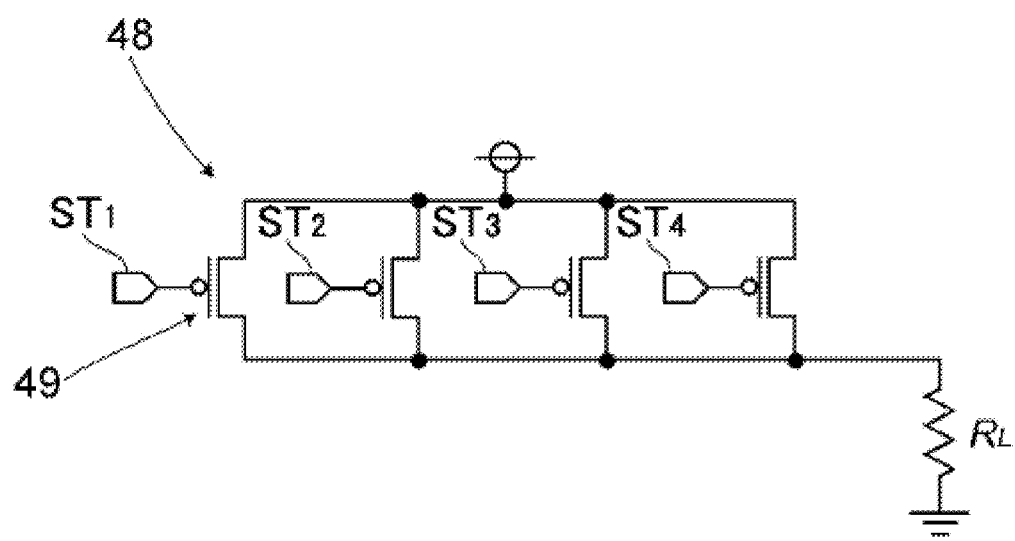
FIG. 11 shows a circuit diagram indicating a sound release circuit connected to TSTC.

Further, in the embodiment described above, the TSTC is applied as a signal conversion circuit to the PLL circuit 1. However, the present invention may be embodied otherwise. The TSTC 8 which generates a soft thermometer code may be applied to kinds of circuits other than the PLL circuit 1. The example shown in FIG. 11 is a sound release circuit 48 where a resistance $R_L$ corresponds to the input to a speaker. The sound from the speaker may be adjusted by controlling the current flowing through the resistance $R_L$ using a soft thermometer code generated by the TSTC 8. Then, connected to each of input terminals ST1, ST2, ST3 and ST4 of the sound release circuit 48 are the outputs from the first stage #1, . . . , and the fourth stage #4 of the signal generation circuits a1, . . . , and a4 of the TSTC, for example.

Then, in the sound release circuit 48, when the outputs from the signal generation circuits a1, . . . , and a4 are given to the gates of PMOS (P-channel Metal Oxide Semiconductor) transistors 49 connected to the input terminals ST1, ST2, ST3 and ST4, respectively, the PMOS transistor goes ON and current flows between drain and source. The TSTC 8 gives the PMOS transistors 49 of the sound release circuit 48 not only digital values but also intermediate analog outputs (analog voltage).

Thus, the PMOS transistors 49 of the sound release circuit 48 go ON. The current flows between drain and source, including the analog current based on the analog output value in the soft thermometer code. Therefore, the sound release circuit 48 can release sounds of fine resolution of sound pressure from the speaker.

Further, in the embodiment described above, the falling edge controlled inverter 16 plays a role of signal processing unit to invert the pulse signal and prolong the time while the pulse signal falls from maximum to minimum, thereby forming a waveform with a smooth slope at the changing point of the pulse signal P1 to obtain analog voltage. However, the present invention may be embodied otherwise. A signal processing unit may invert the pulse signal and prolong the time while the pulse signal rises from minimum to maximum, thereby forming a waveform with a smooth slope at the changing point of the pulse signal P1 to obtain analog voltage. Or, a signal processing unit may just prolong the time, without inverting the pulse signal, thereby forming a waveform with a smooth slope at the changing point of the pulse signal to obtain analog voltage. Other kinds of pulse signal may be used to form a waveform with smooth slope at the changing point to obtain analog voltage. The signal processing unit may be embodied by other than an inverter. The signal processing unit may be embodied by a DA conversion circuit, for example, or other kinds of circuits.

Further, in the embodiment described above, the FED plays a role of pulse transition detection unit to detect falling of the pulse signal. However, the present invention may be embodied otherwise. The pulse transition detection unit may detect rising of the pulse signal or other kinds of transitions.

(6) Phase Control Circuit

The PLL circuit 1 shown in FIG. 1 is shown in FIG. 12A. In the PLL circuit 1, as shown in FIG. 12B, the phase of divided signal $f_{div}$ which is PLL output signal $f_{VCO}$ with oscillation frequency outputted from the PWCO 4 and the phase of input signal $f_{ref}$ with a particular clock frequency is the pulse width of phase difference output (pulse signal) to control the PWCO 4. Thus, the phase of divided signal $f_{div}$ is not the same with that of the input signal $f_{ref}$.

That is, though the PLL circuit 1 is configured to control the frequency of the PLL output signal $f_{VCO}$ outputted from the PWCO 4, the PLL circuit 1 is not configured to control the phase of $f_{VCO}$. Because phase adjustment is required for clock tree synthesis of a whole system where plurality kinds of chips, not just one chip, are used with various frequencies, the PLL circuit 1 is hard to use as it is. Thus, in the following, a delay adjustment circuit which is configured to match the phase of the PLL output signal $f_{VCO}$ outputted from the PLL circuit 1 and the phase of the input signal $f_{ref}$ is described.

(6-1) Phase Control Circuit Configuration

Figure 13:
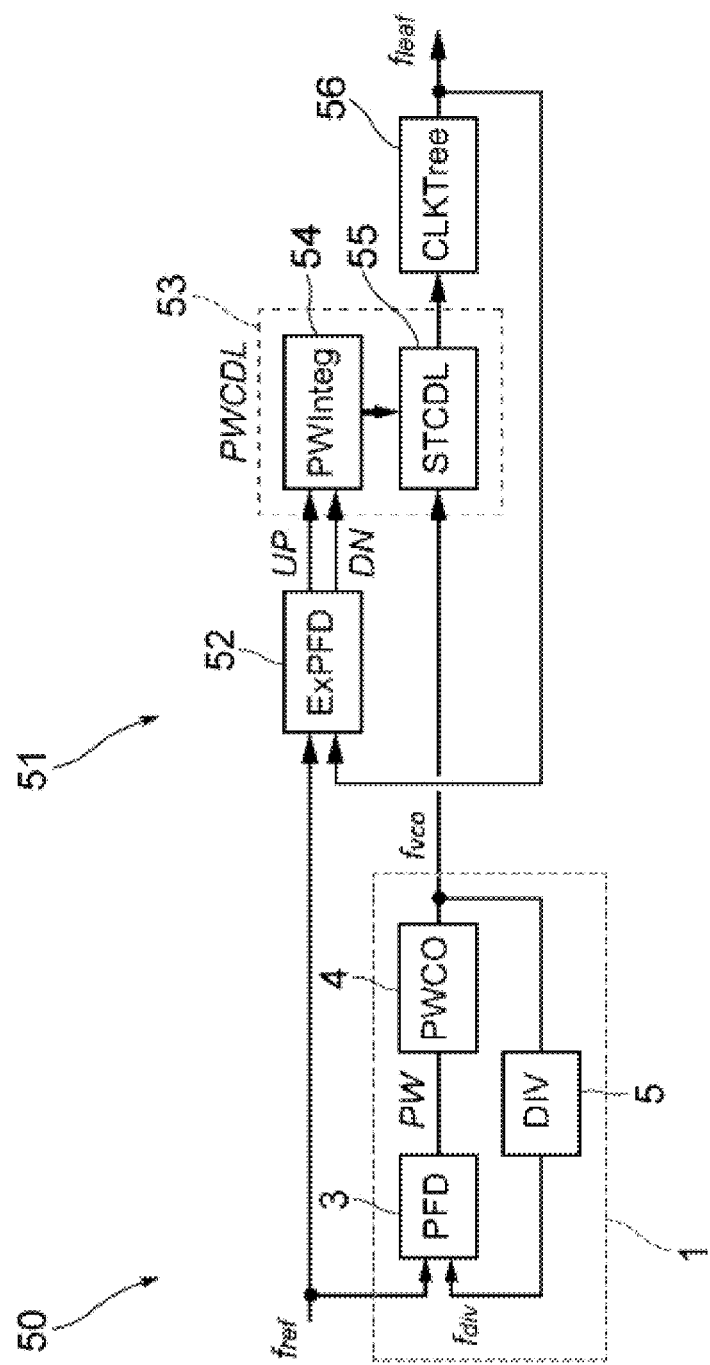
FIG. 13 shows a block diagram indicating a whole configuration of a phase control circuit with a PLL circuit.

In FIG. 13, the phase control circuit in accordance with the present invention is denoted by 50, including the PLL circuit 1 described above and a delay adjustment circuit 51. The PLL circuit 1 is the same with the PLL circuit 1 in FIG. 1 already described above. So, the detail of the PLL circuit 1 is omitted and the delay adjustment circuit 51 is described in detail here. The delay adjustment circuit 51 includes an Extended Phase Frequency Detector (denoted simply by ExPFD in the following) 52 to which the input signal $f_{ref}$ is inputted, a Pulse Width Controlled Delay Line (denoted by PWCDL in the following) 53 which is configured to receive the PLL output signal $f_{VCO}$ as an external input signal from the PLL circuit 1 based on the pulse width of the phase difference output (pulse signal) inputted from the ExPFD 52 and a CLocK Tree circuit (denoted by "CLKTree" in the following) 56 which generates an internal clock provided for internal circuits based on the output signal from the PWCDL 53 and outputs the internal clock as a terminal output signal $f_{leaf}$.

The delay adjustment circuit 51 outputs the terminal output frequency $f_{leaf}$ which is a delay output frequency generated at the CLKTree 56 to the ExPFD 52 and the output unit, compares the phases of the input signal $f_{ref}$ and the terminal output signal $f_{leaf}$ which have different frequencies, and outputs an UP pulse signal and a DN pulse signal described below as phase difference output to the PWCDL 53. The PWCDL 53 is configured to generate a soft thermometer code described above based on the UP pulse signal and a DN pulse signal, control delay of the PLL output signal $f_{VCO}$ outputted from the PLL circuit 1 based on the soft thermometer code, and output the output signal which is a phase adjusted frequency whose delay is controlled to the CLKTree 56. The delay adjustment circuit 51 compares again the phases of the terminal output signal $f_{leaf}$ from the CLKTree 56 and the input signal $f_{ref}$ at the ExPFD. Thus, the delay adjustment circuit 51 is configured to adjust the phases of the terminal output signal $f_{leaf}$ and the input signal $f_{ref}$.

Here, the frequency of the terminal output signal $f_{leaf}$ which is a phase controlled signal is the same with that of the PLL output signal $f_{VCO}$ and different from that of the input signal $f_{ref}$. In addition, "to match the phases of different frequencies" is defined here as to make a faster frequency signal (terminal output signal $f_{leaf}$, for example) rise at the same time with a later frequency signal (input signal $f_{ref}$).

Figure 14:
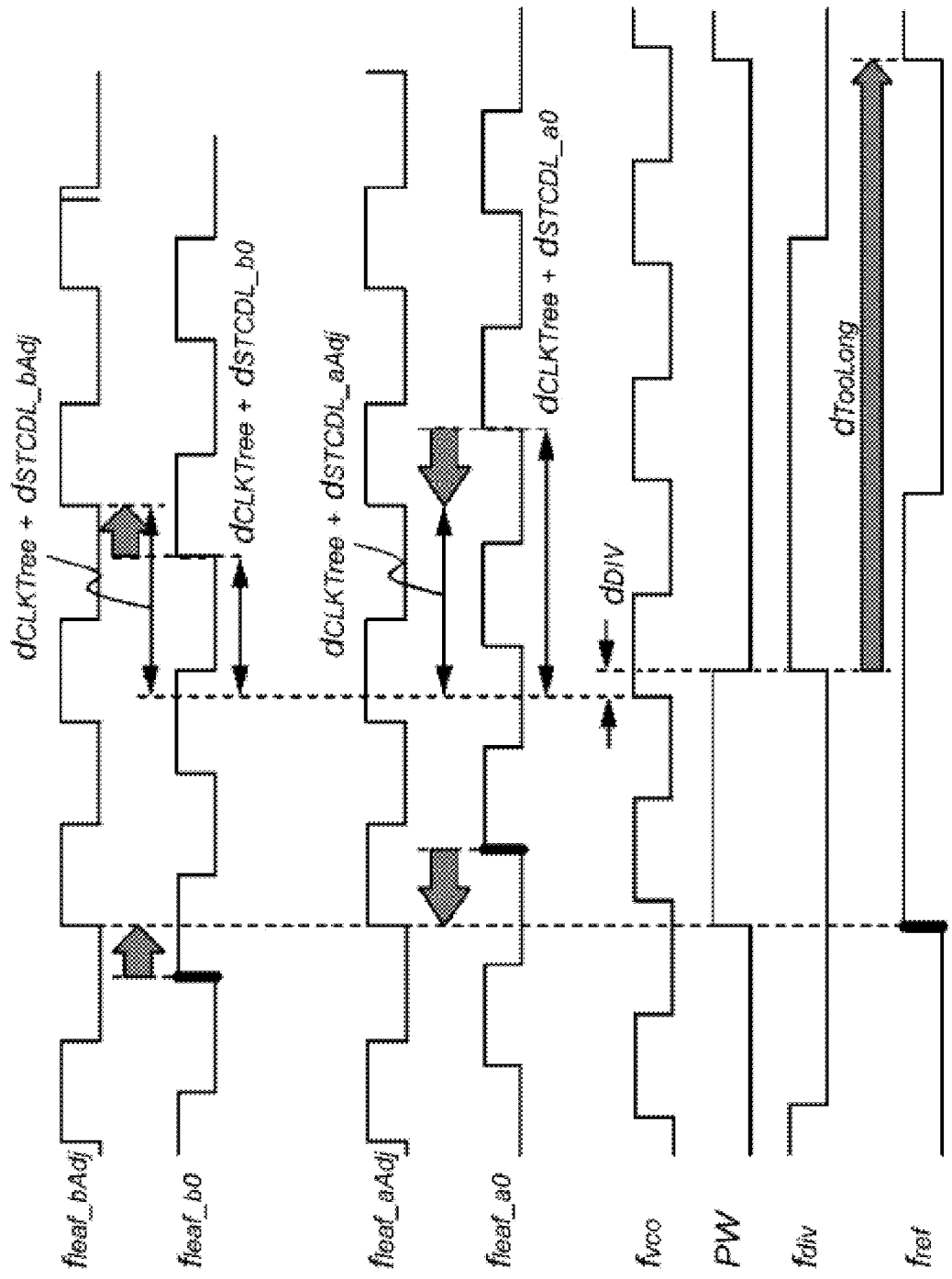
FIG. 14 shows a timing diagram indicating kinds of signals of the phase control circuit in FIG. 13.

Then, as shown in FIG. 14, if matching of phases of the divided signal $f_{div}$ in the PLL circuit 1 and the input signal $f_{ref}$ which have the same frequency is required, it is necessary to delay the divided signal $f_{div}$ by as much delay amount as dTooLong. Thus, under this requirement, the delay amount dTooLong is so large that a delay circuit which needs large circuit area and much power consumption is required.

On the other hand, as for the delay adjustment circuit 51, the terminal output signal $f_{leaf}$ such as $f_{leaf\_a0}$ or $f_{leaf\_b0}$ is adjusted to match the input signal $f_{ref}$. Thus, because the delay control of the terminal output signal is less than the period of $f_{leaf\_a0}$ or $f_{leaf\_b0}$, the phase control can be reduced and circuit miniaturization and power reduction can be promoted.

The nearest rising among pluralities of rising of the terminal output signal $f_{leaf}$ with the faster frequency to a rising of the input signal $f_{ref}$ is matched to the rising of the input signal $f_{ref}$. For example, as shown in FIG. 14, when the terminal output signal $f_{leaf\_a0}$ is output from the CLKTree 56, because the rising of the terminal output signal fleaf_a0 is positioned near from the rising of the input signal $f_{ref}$ anterior to the rising of the terminal output signal $f_{leaf\_a0}$, an adjusted terminal output signal $f_{leaf\_aAdj}$ can be generated by shifting the terminal output signal $f_{leaf\_a0}$ forward and matching the rising of the shifted terminal output signal and the rising of the input signal $f_{ref}$.

On the other hand, when the terminal output signal $f_{leaf\_b0}$ is output, because the rising of the terminal output signal $f_{leaf\_b0}$ is positioned near from the rising of the input signal, $f_{ref}$ posterior to the rising of the terminal output signal $f_{leaf\_b0}$, an adjusted terminal output signal $f_{leaf\_bAdj}$ can be generated by shifting the terminal output signal $f_{leaf\_a0}$ backward and matching the rising of the shifted terminal output signal and the rising of the input signal $f_{ref}$.

Concretely, the PWCDL 53 shown in FIG. 13 includes a Pulse Width Integrator (denoted by PWInteg in the following) 54 which integrates each pulse width of UP pulse signals and DN pulse signals from the ExPFD 52, and a Soft Thermometer code Controlled Width Integrator (denoted by STCDL in the following) 55 which controls the delay of the PLL output signal $f_{VCO}$ based on the soft thermometer code generated by the PWInteg 54.

As shown in FIG. 14, when the delay amount of the terminal output signal $f_{leaf\_a0}$ at the initial state of the STCDL 55 when the terminal output signal $f_{leaf\_a0}$ is output is denoted by $d_{STCDL\_a0}$, and the delay of the CLKTree 56 is denoted by $d_{CLKTree}$, the delay of the PLL output signal $f_{VCO}$ at the initial state from the rising to the terminal output signal $f_{leaf\_a0}$ is expressed by $d_{CLKTree}+d_{STCDL\_a0}$. In addition, when the delay amount of the terminal output signal $f_{leaf\_b0}$ at the initial state of the STCDL 55 when the terminal output signal $f_{leaf\_b0}$ is output is denoted by $d_{STCDL\_b0}$, the delay of the PLL output signal $f_{VCO}$ at the initial state from the rising to the terminal output signal $f_{leaf\_a0}$ is expressed by, with the delay $d_{CLXTree}$ of the CLKTree 56, $d_{CLKTree}+d_{STCDL\_b0}$.

When the delay at the initial state is $d_{STCDL\_a0}$, the STCDL 55 is configured to match the terminal output signal $f_{leaf\_a0}$ and the input signal $f_{ref}$ by shortening the delay $d_{STCDL\_a0}$ to $d_{STCDL\_aAdj}$ in order to adjust the phase. And when the delay at the initial state is $d_{STCDL\_b0}$, the STCDL 55 is configured to match the terminal output signal $f_{leaf\_b0}$ and the input signal $f_{ref}$ by prolonging the delay $d_{STCDL\_b0}$ to $d_{STCDL\_bAdj}$ in order to adjust the phase.

As described above, the delay control circuit 51 is configured to generate the adjusted terminal output signal $f_{leaf\_aAdj}$ and the adjusted terminal output signal $f_{leaf\_bAdj}$ whose rising edges are adjusted in order to match the rising edge of the input signal $f_{ref}$ as examples of the terminal output signal $f_{leaf}$ or a phase adjusted frequency. Therefore, the phase control circuit 50 in accordance with the present invention is configured to control the frequency of the PLL output signal $f_{VCO}$ using the PLL circuit 1, and to control the phase of the PLL output signal $f_{VCO}$ using the delay adjustment circuit 51.

(6-2) Delay Adjustment Circuit

Below, the delay control circuit 51 is described. First, the ExPFD 52 which compares the phases of different frequencies is described. Then, the PWCDL 53 which generates a soft thermometer code based on two pulse signals (UP pulse signal and DN pulse signal described below) from the ExPFD 52 and controls the delay of the PLL output signal $f_{VCO}$ based on the soft thermometer code is described.

Figure 15:
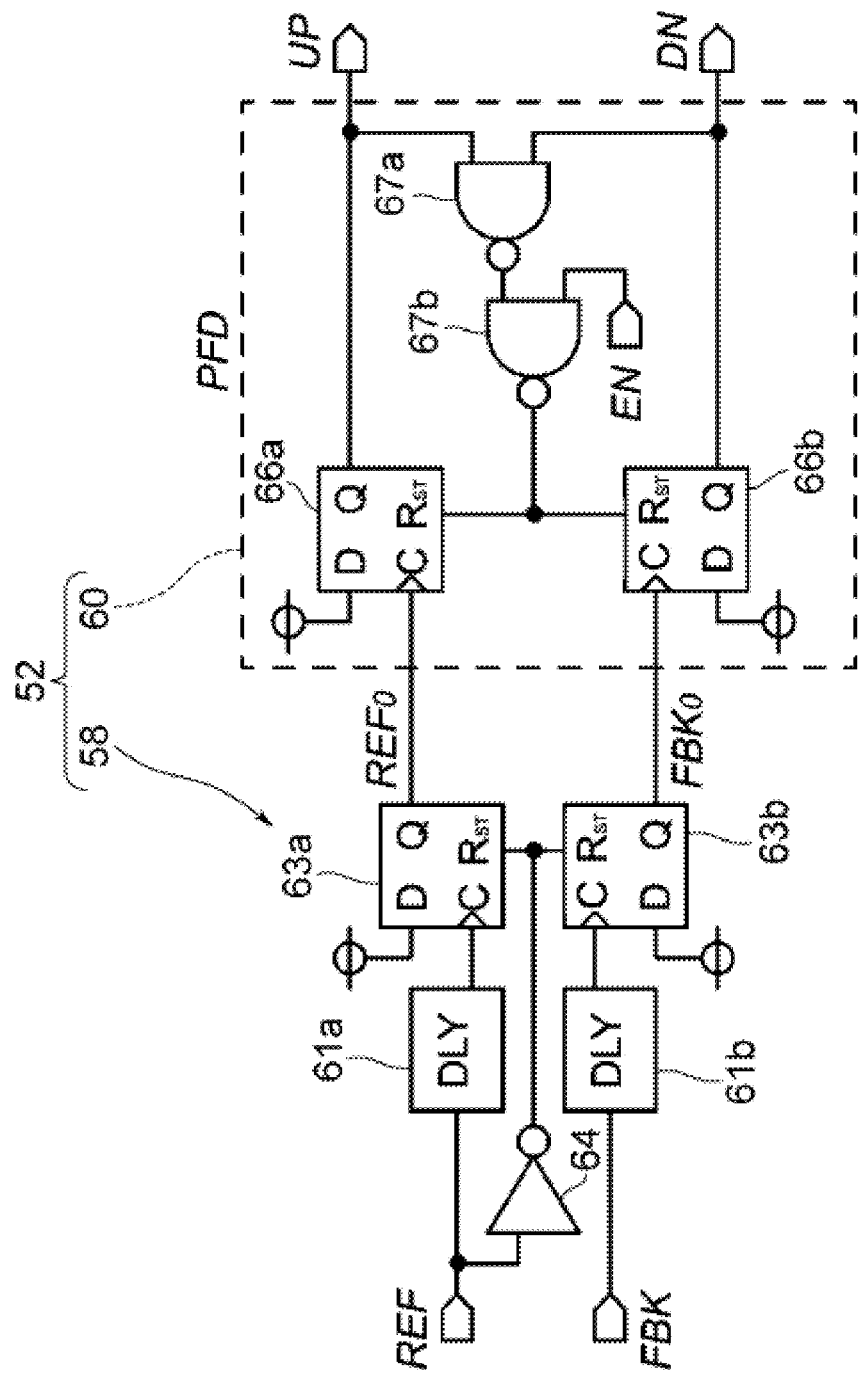
FIG. 15 shows a circuit diagram indicating the configuration of ExPFD circuit.

As shown in FIG. 15, the ExPFD 52 includes an extension circuit 58, the former stage, and a PFD 60, the latter stage.

The extension circuit 58 is configured to measure the rising timings of two input signals of the input signal $f_{ref}$ (denoted by REF in the figure and in the following) and the terminal output signal $f_{leaf}$ (denoted by FBK in the figure and in the following) fed back from the CLKTree 56, only around the rising edge of the input signal $f_{ref}$ with the lower frequency.

Concretely, the extension circuit 58 is configured to input REF, the input signal $f_{ref}$, to a delay circuit (denoted simply by DLY in the following) 61a to make the DLY 61a generate a delayed REF_$_{delayed}$ which is a delayed REF, and then to input the delayed REF_$_{delayed}$ to the clock terminal of a delay flip flop (denoted simply by DFF in the following) 63a, a frequency controlled circuit. Additionally, the extension circuit 58 is configured to input FBK, the terminal output signal $f_{leaf}$, to a DLY 61b to make the DLY 61b generate a delayed FBK_$_{delayed}$ which is a delayed FBK, and then to input the delayed FBK_$_{delayed}$ to the clock terminal of 63b. Here, to the input terminal D of the DFF 63a or 63b or the like, signals corresponding to bit '1' (for example, source voltage VDD) may be input.

Figure 16:
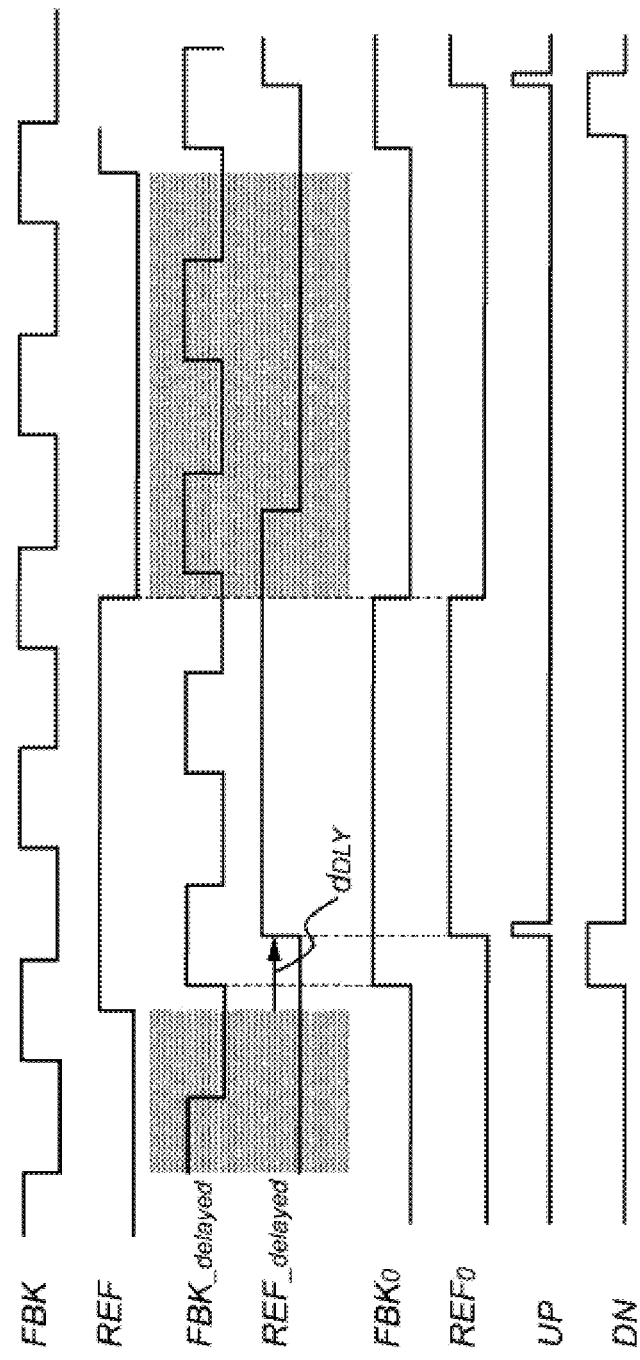
FIG. 16 shows a timing diagram indicating kinds of signals of ExPFD in FIG. 15.

In addition, the extension circuit 58 is configured to input REF to an inverter 64, too, to input an inverted REF, inverted by the inverter 64, to the reset terminal of each of the DFF 63a and 63b without delay. Thus, the DFF 63a and 63b are configured to detect the rising edge and the falling edge of the inverted REF inputted to the reset terminals. Based on such configurations, as shown in FIG. 16, the DFF 63a and 63b are able to activate reset state (shown as grey area in the figure) while the REF, which is not inputted to the inverter 64 yet, is at minimum and to deactivate the reset state only while the REF is at maximum. The DFF 63a and 63b are configured to keep generating High signals from the reset state is deactivated and FBK_$_{delayed}$ and REF_$_{delayed}$ rises for the first time, respectively, until the DFF 63a and 63b deactivate the reset state, respectively. As shown in FIG. 15, the DFF 63a and 63b are configured to output the High signals as REF$_O$ and FBK$_O$, respectively, from the output terminal Q to the PFD 60.

Next, the PFD 60 is a common phase comparison circuit which is configured to compare the rising edges of the REF$_O$ and the FBK$_O$. The PFD 60 is configured to generate two pulse signals of DN pulse signal and UP pulse signal as comparison result, unlike the PFD 3 in FIG. 1 described above which generates one pulse signal, and to output them to the PWInteg 54. Concretely, the PFD 60 includes DFF 66a and 66b. The PFD 60 is configured to receive REF$_O$ at the clock terminal of the DFF 66a and receive FBK$_O$ at the clock terminal of the DFF 66b. In addition, the output terminals Q of each of the DFF 66a and 66b are connected to input terminals of a NAND circuit 67a. The output terminal of the NAND circuit 67a is connected to an input terminal of an end NAND circuit 67b. Further, the end NAND circuit 67b is connected to the reset terminals of DFF 66a and 66b.

By such configuration described above, in the PFD 60, when High signal '1' to the input terminals of the NAND circuit 67a, as an example of the signals indicating the maximum state of the REF$_O$ and FBK$_O$, LOW signal '0' is inputted from the NAND circuit 67a to the input terminal of the end NAND circuit 67b. Then, High signal '1' is inputted from the output terminal of the end NAND circuit 67b to the reset terminals of each of the DFF 66a and 66b. Then, the DFF 66a and 66b activate the reset states based on the High signal '1' from the end NAND circuit 67b and LOW signals are output as the UP pulse signal and the DN pulse signal from each of the output terminals.

For example, as shown in FIG. 16, when the rising edge of FBKO is inputted faster than that of the REF$_O$ to the PFD60, by inputting the rising edge of the FBK$_O$ to DFF 66b, the output terminal Q of the DFF 66b keeps generating High as the DN pulse signal. Then, when the rising edge of the REFO is inputted to the DFF 66a, the output terminal Q of the DFF 66a generates High as the UP pulse signal. By this, via the NAND circuit 67a, the end NAND circuit 67b generates High signal '1' and the DFF 66a and 66b activate the reset states.

Therefore, the DN pulse signal keeps High from the rising edge of the FBK$_O$ is inputted until the reset state is activated. Thus, such a pulse is output to the PWCDL 53. On the other hand, the UP pulse signal keeps High only for the moment and such a pulse is output to the PWCDL 53.

Next, the PWCDL 53 is described in the following. The PWCDL shown in FIG. 13 does not require conventional analog control of voltage-domain, which prevents from promoting miniaturization. Thus, the delay control circuit 51 need not include a low-pass filter of capacitor Cm with a large layout area, required for converting pulse width to voltage. Accordingly, miniaturization and cost reduction are promoted.

Concretely, the PWCDL 53 is configured to determine the delay amount to control the delay of the PLL output signal $f_{VCO}$, when the UP pulse signal and the DN pulse signal which indicate the phase difference output with a particular pulse width are inputted from the PFD 60, based on the UP pulse signal and the DN pulse signal. The PWCDL 53 is configured to generate binary digital values of voltage 0 (denoted simply by 0 in the following) or voltage V$_{DD}$ (denoted simply by 1 in the following) based on the UP pulse signal and the DN pulse signal to express the UP pulse signal and the DN pulse signal by 0 and 1.

Additionally, the delay amount generated based on the UP pulse signal and the DN pulse signal may not be expressed only by either 0 or 1 but also expressed by analog voltage which ranges between 0 and 1 only at the boundary where the signal transits between 0 and 1, thereby preventing the occurrence of quantization noise induced by digitalization.

Here, analog voltage means, as described above, an arbitrary intermediate value between digital binary values of 0 and 1 such as 0.3, 0.4, 0.5 and so on. The variance of analog voltage (an arbitrary intermediate value such as 0.3, 0.4, 0.5 and so on) is determined by the width difference between the pulse width of the UP pulse signal and the pulse width of the DN pulse signal. Thus, the PWCDL 53 is configured to express the delay amount generated based on the width difference between the pulse width of the UP pulse signal and the pulse width of the DN pulse signal using intermediate analog voltage such as 0.5, for example, in '1, 1, 1, 0.5, 0, 0, . . . , 0.'

Here, the code with the sequence of 1 and the sequence of 0 for indicating the amount of delay by the boundary of 0 and 1, such as ' . . . , 1, 1, 0, 0' is called a thermometer code. As for the present invention, analog voltage, other than binary 0 and 1, is used to express the changing point between 0 and 1. Here again, the thermometer code with analog voltage only at the changing point between 0 and 1 is called a soft thermometer code.

When the soft thermometer code for indicating the delay amount is '1, 1, 1, 0.4, 0, 0, 0, 0,' if the UP pulse signal with the pulse signal of 100 [ps] and the DN pulse signal with the pulse signal of 40 [ps] are input from the ExPFD 52, the PWCDL 53 detects the width difference 60 [ps] between the pulse width of the UP pulse signal and the pulse width of the DN pulse signal. The variance at the boundary of the soft thermometer code is determined by the width difference and is shifted in an analog way to '1, 1, 1, 0.2, 0, 0, 0, 0,' given that the width difference of 60 [ps] corresponds to the analog variance of 0.2 in the soft thermometer code.

If the UP pulse signal (pulse width of 100 [ps]) and the DN pulse signal (pulse width of 40 [ps]) of the same pulse signal are input again, the PWCDL shifts the boundary of 0 and 1 in the soft thermometer code '1, 1, 1, 0.2, 0, 0, 0, 0' to, in an analog way, '1, 1, 1, 0.0, 0, 0, 0, 0' based on the width difference of 60 [ps].

Further, if the UP pulse signal (pulse width of 100 [ps]) and the DN pulse signal (pulse width of 40 [ps]) of the same pulse signal are input again, the PWCDL shifts the boundary of 0 and 1 in the soft thermometer code '1, 1, 1, 0.0, 0, 0, 0, 0' to, in an analog way, '1, 1, 0.8, 0, 0, 0, 0, 0' based on the width difference of 60 [ps]. Further, if the UP pulse signal (pulse width of 100 [ps]) and the DN pulse signal (pulse width of 40 [ps]) of the same pulse signal are input again, the PWCDL similarly changes the soft thermometer code to '1, 1, 0.6, 0, 0, 0, 0, 0.'

Here, if the UP pulse signal with narrower pulse width of 70 [ps] and the DN pulse signal with the same pulse width of 40 [ps] are input from the ExPFD 52, the width difference between the pulse width of the UP pulse signal and the pulse width of the DN pulse signal is 30 [ps], half of the width difference described above. Then, the analog variance at the boundary in the soft thermometer code also becomes half. Now, the soft thermometer code is '1, 1, 0.5, 0, 0, 0, 0, 0' because the analog variance in the soft thermometer becomes half, 0.1, due to the half pulse difference, 30 [ps].

As described above, the delay adjustment circuit 51 is configured to express the delay amount for controlling the delay of the PLL output signal $f_{VCO}$, based on the UP pulse signal and the DN pulse signal, using digital values of 0 and 1, and analog voltage which ranges between 0 and 1. Such a configuration prevents the occurrence of quantization noise.

Figure 17:
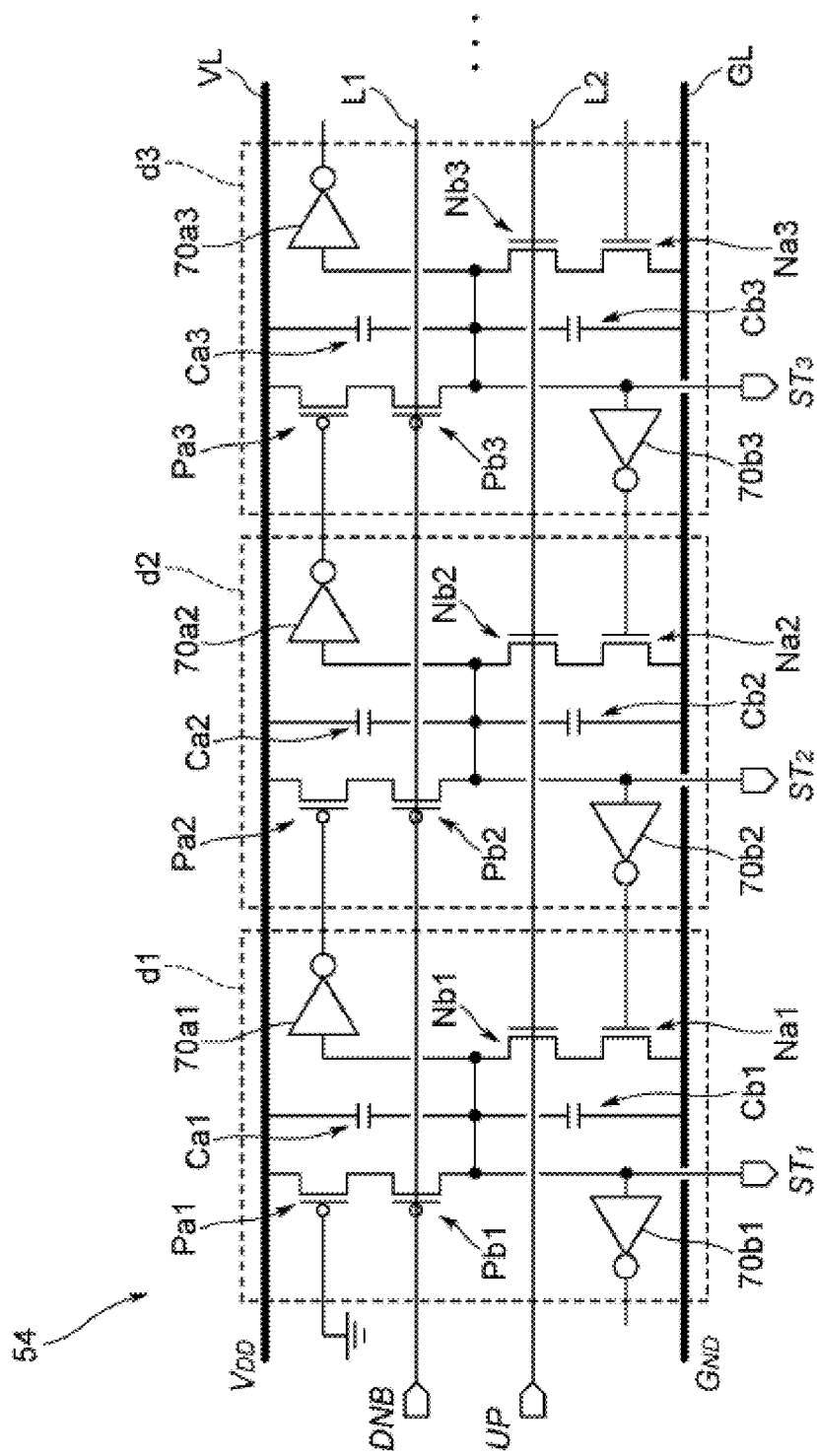
FIG. 17 shows a circuit diagram indicating the specific configuration of PWInteg.

Concretely, FIG. 17 shows the circuit configuration of the PWInteg 54 in the PWCDL 52. The PWInteg 54 includes plurality of stages of signal generation circuits d1, d2, d3 . . . allocated in parallel in rows (in horizontal direction), for example. These signal generation circuits d1, d2, d3 . . . take samples from the UP pulse signal and the DN pulse signal. The PWInteg 54 is configured to convert the signal values taken as samples from the UP pulse signal and the DN pulse signal into digital output values expressed by 0 or 1 and the sample value at the boundary of 0 and 1 into analog voltage value other than the binary values. The PWInteg 54 is configured to output the converted values.

In the PWInteg 54, DNB pulse signal which is inversion of the DN pulse signal from the ExPFD 52 is input into the first line L1 allocated along in horizontal direction via DNB input unit (denoted by DNB on the left side in the figure). And the UP pulse signal from the ExPFD 52 is input into the second line L2 allocated in parallel with the first line L1 via UP input unit (denoted by UP on the left side in the figure).

The first line L1 is connected to the gates of PMOS transistors Pb1, Pb2, Pb3 . . . in the signal generation circuits d1, d2, d3 . . . , respectively. The DNB pulse signal inputted from the DNB input unit can be inputted to the gates of each of the PMOS transistors Pb1, Pb2, Pb3 . . . . Here, one end of the PMOS transistor Pb2 of the signal generation circuit d2, for example, is connected to one end of another PMOS transistor Pa2 whose other end is connected to power source line (the line denoted by $V_{DD}$ in the figure) of voltage $V_{DD}$, for example. The PMOS transistor Pb2 is configured to output, from the other end of the PMOS transistor Pb2, the power source voltage $V_{DD}$ received from the power source line via another PMOS transistor Pa2 by going ON while another PMOS transistor Pa2 goes ON.

Here, to the gate of the PMOS transistor Pa2 whose one end is connected to the power source line, the output of an inverter 70a1 allocated in the former stage is connected. The PMOS transistor Pa2 is configured to go ON/OFF according to the output voltage of the inverter 70a1. And to the other end of the PMOS transistor Pb2 connected to the first line L1, the output unit (denoted by ST2 in the figure) connected to the STCDL 55, the input terminal of an inverter 70b2 whose output terminal is connected to the gate of an NMOS transistor Na1 in the former stage, capacitors Ca2 and Cb2 of particular capacitance, the input terminal of an inverter 70a2 whose output terminal is connected to the gate of a PMOS transistor Pa3 in the next stage, and one end of an NMOS transistor Nb2.

If the voltage applied on the capacitor Ca2 and Cb2 is High, the signal generation circuit d2 is configured to turn a PMOS transistor Pa3 in the next stage ON via the inverter 70a2. On the other hand, if the voltage applied on the capacitor Ca2 and Cb2 is Low, the signal generation circuit d2 is configured to turn the NMOS transistor Na1 in the former stage ON via the inverter 70b2. Concretely, in the signal generation circuit d2, if the DNB pulse signal of LOW is input to the gate of the PMOS transistor Pb2 from the first line L1, the PMOS transistor Pb2 is turned ON. If the PMOS transistor Pa2 is turned ON, the capacitors Ca2 and Cb2 are kept charging from the power source line only while the DNB pulse signal is Low, which increases the output voltage of the ST2.

Then, the inverter 70b2 shown in the lower side is configured to generate Low signal by inverting High signal inputted from its input terminal. The Low signal is input into the gate of the NMOS transistor Na1 of the former stage, thereby turning the NMOS transistor Na1 OFF. The inverter 70 a2 shown in the upper side is configured to generate Low signal by inverting the High signal. The Low signal is input into the gate of the PMOS transistor Pa3 of the latter stage, thereby turning the PMOS transistor Pa3 ON. Thus, in the next signal generation circuit d3, too, when the DNB pulse signal of Low is input to the gate of the PMOS transistor from the first line L1, the PMOS transistor Pb3 turns ON. And only while the DNB pulse signal is Low, the capacitors Ca3 and Cb3 keep being charged, via the PMOS transistor Pa3 at ON state, and the output voltage of the ST3 is increased.

Next, the case where the UP pulse signal of High is input into the signal generation circuit d2, for example, via the second line L2 is described. When the UP pulse signal of High is input into the gate of the NMOS transistor Nb2 from the second line L2, the NMOS transistor Nb2 turns ON. Then, if the NMOS transistor Na2 is ON, only while the UP pulse signal is High, the capacitors Ca2 and Cb2 are connected to the ground line and are discharged. Thus, in the signal generation circuit d2, Low signal is generated, thereby decreasing the output voltage of ST2.

Then, the inverter 70a2 shown in the upper side is configured to generate High signal by inverting the Low signal. The High signal is input to the gate of the PMOS transistor Pa3 of the latter stage, thereby turning the PMOS transistor Pa3 OFF. The inverter 70b2 shown in the lower side is configured to generate High signal by inverting the Low signal. The High signal is input to the gate of the NMOS transistor Na1 of the former stage, thereby turning the NMOS transistor Na1 ON.

Therefore, in the PWInteg 54, given that there is the boundary in the soft thermometer code (analog voltage at the boundary between 0 and 1) at the second bit, for example, because High signal is generated in the signal generation circuit d1 which process the first bit, the PMOS transistor Pa2 of the signal generation circuit d2 which process the second bit turns ON. Because, in the signal generation circuit d2 which process the second bit, the PMOS transistor Pb2 is ON only while the DNB pulse signal is Low (that is, while the DN pulse signal before inversion is High), the capacitors Ca2 and Cb2 can be charged via the PMOS transistor Pa2 and the PMOS transistor Pb2 while the DNB pulse signal is Low.

Here, because it is given that there is the boundary (the boundary between 0 and 1) in the soft thermometer code at the second bit, Low signal is generated in the signal generation circuit d3 which process the third bit. Then, in the signal generation circuit d2, High signal is input into the NMOS transistor Na2 via the inverter 70b3 based on the Low signal generated in the signal generation circuit d3 for the third bit, and the NMOS transistor Na2 is turned ON.

Thus, in the signal generation circuit d2 which process the second bit, because the NMOS transistor Nb2 is ON only while the UP pulse signal is High, the capacitors Ca2 and Cb2 are discharged while the UP pulse signal is High via the NMOS transistor Nb2 and the NMOS transistor Na2.

Therefore, in the signal generation circuit d2 which process the second bit at the boundary of the soft thermometer code, the charge of the capacitors Ca2 and Cb2 are adjusted according to the span when the DNB pulse signal is Low and the span when the UP pulse signal is High. Then, the signal generation circuit d2 is configured to generate an output signal in which an analog voltage value other than 0 or 1 is shifted in an analog way, and to output the output signal to the STCDL 55 via the output unit (denoted by the line ST2 in the figure).

FIG. 18A shows an example of a soft thermometer code, generated in the PWInteg 54, where '1' is given to the first bit through the third bit, '0' is given to the fifth bit through the eighth bit, an intermediate analog voltage value between '1' and '0' is given to the fourth bit which is the boundary of the thermometer code. The STCDL 55 is configured to receive such a soft thermometer code outputted from the PWInteg 54 and to control the delay of the PLL output signal $f_{VCO}$ according to the soft thermometer code.

Concretely, as shown in FIG. 18B where the same signs with those in FIG. 2 are put to the corresponding parts, in the STCDL 55, the line $ST_1$ of the first stage of the delay control circuit e1 is connected to the line $ST_1$ (shown in FIG. 17) of the first stage of the signal generation circuit d1. The line $ST_2$ of the second stage of the delay control circuit e2 is connected to the line $ST_2$ (shown in FIG. 17) of the second stage of the signal generation circuit d2. Each stage of the delay control circuit e1, e2 . . . , eN is connected to each stage of the signal generation circuit d1, d2 . . . , dN, respectively.

In the STCDL 55, the PLL output signal $f_{VCO}$ is input to the input unit IN. The STCDL 55 is configured to control the delay of the PLL output signal $f_{VCO}$ using each of the delay control circuit e1, e2 . . . , eN to output from the output unit OUT. The STCDL 55 is configured such that the load on the inverter 19 is controlled individually by each of the delay control circuit e1, e2 . . . , eN. And the STCDL 55 is configured to delay the PLL output signal fVCO by the delay amount based on the loads on each of inverters 19.

The delay control circuit e1, for example, includes an NMOS transistor 21. The gate of the NMOS transistor 21 is connected to the output terminal of the signal generation circuit d1. The drain of the NMOS transistor 21 is connected to the capacitor 22 of capacitance CL which puts load on the inverter 19 and the source of the NMOS transistor 21 is connected to the output line.

Then, if the output from the signal generation circuit d1 which is connected to the gate of the NMOS transistor 21 is 0, the NMOS transistor 21 turns OFF. Thus, in the delay control circuit e1, the capacitor 22 connected to the drain does not put load on the inverter 19. And the PLL output signal $f_{VCO}$ goes through the delay control circuit e1 without delay.

On the other hand, if the output from the signal generation circuit d1 which is connected to the gate of the NMOS transistor 21 is 1, the NMOS transistor 21 turns ON. Thus, in the delay control circuit e1, the capacitor 22 connected to the drain puts load on the inverter 19, which delays the PLL output signal $f_{VCO}$. Therefore, the STCDL 55 is configured such that the more 1s are output from the PWInteg 54 to the delay control circuits e1, e2 . . . , eN, the more loads are put and the more the PLL output signal $f_{VCO}$ is delayed while the PLL output signal $f_{VCO}$ goes from the input unit IN through the output unit OUT.

Additionally, in the delay control circuit e2, for example, if analog output (analog voltage) other than 0 or 1 is given to the gate from the signal generation circuit d2, then the NMOS transistor 21 turns ON. The analog load according to the analog output is put on the inverter 19 by the capacitor 22, which delays the PLL output signal $f_{VCO}$ accordingly. For example, if '0.5' is given to the gate of the NMOS transistor 21 as an intermediate analog output value between 0 and 1 from the signal generation circuit d2, the NMOS transistor 21 turns ON according to the capacitance, and analog load corresponding to the '0.5' is put on the inverter 19 by the capacitor 22.

Therefore, the STCDL 55 is configured, as described referring to FIG. 14, if the initial delay is $d_{STCDL\_a0}$, to generate an output signal in order to match the rising of the terminal output signal $f_{leaf\_a0}$, and the rising of the input signal $f_{ref}$, based on the adjustment of the phase of the terminal output signal $f_{leaf\_a0}$ by narrowing the delay $d_{STCDL\_a0}$ to the delay $d_{STCDL\_aAdj}$. Besides, the STCDL 55 is configured, if the initial delay is $d_{STCDL\_b0}$, to generate an output signal in order to match the rising of the terminal output signal $f_{leaf\_b0}$ and the rising of the input signal $f_{ref}$ based on the adjustment of the phase of the terminal output signal $f_{leaf\_b0}$ by prolonging the delay $d_{STCDL\_b0}$ to the delay $d_{STCDL\_bAdj}$.

(6-3) Behavior and Effect

By such a configuration described above, the PWInteg 54 generates a soft thermometer code according to the pulse width of an inputted UP pulse signal and the pulse width of an inputted DN pulse signal. That is, the PWInteg 54 integrates each of the UP pulse signal and the DN pulse signal, and based on the UP pulse signal and the DN pulse signal, generates binary digital output values of 0 or 1 and analog variance only at the boundary between 0 and 1 to generate a soft thermometer code indicating the delay amount including digital output values of 0 and 1 and an analog voltage (an intermediate output value).

Thus, the PWInteg 54 does not require a low-pass filter of capacitor Cm with large layout area for converting pulse width to voltage, which promotes miniaturization and cost reduction. Besides, because the PWInteg 54 can generate analog voltage in accordance with the change at the boundary which determines the delay amount, quantization noise can be reduced compared with the conventional DLL circuit.

Additionally, with the STCDL 55 which controls the delay amount of the PLL output signal $f_{VCO}$ according to the soft thermometer code generated by the PWInteg 54, the delay adjustment circuit 51 which matches the phase of the input signal fref inputted from the input unit and the phase of the terminal output signal fleaf from the CLKTree 56 can be realized.

In the embodiment described above, it is given that the first pulse signal indicates the phase difference of two frequencies, that the second pulse signal indicates the rising of the later frequency of the two frequencies, and that, as shown in FIG. 16, the rising edge of the $FBK_O$ is input to the PFD 60 faster than the rising edge of the $REF_O$. Thus, described is the case where the first pulse signal which indicates the phase difference of the two frequencies ($FBK_O$ and $REF_O$ in the embodiment above) is the DN pulse signal and the second pulse signal which indicates the rising of the later frequency ($REF_O$ in the embodiment above) is the UP pulse signal.

However, the present invention may be embodiment otherwise. For example, contrary to the case in FIG. 16, if the rising edge of the REFO is input to the PFD 60 faster than the rising edge of the FBKO, the first pulse signal which indicates the phase difference of the two frequencies ($FBK_O$ and $REF_O$, here) is the UP pulse signal and the second pulse signal which indicates the rising of the later frequency ($FBK_O$, here) is the DN pulse signal.

The embodiments of the present invention is not restricted to the embodiments described above and may be embodied in various ways within the gist of the present invention. For example, the delay adjustment circuit 51 may not include the CLKTree 56. And the output signal from the PWCDL 53 may be fed back to the ExPFD 52 as the output frequency.

(7) Delay Adjustment Circuit

Figure 19:
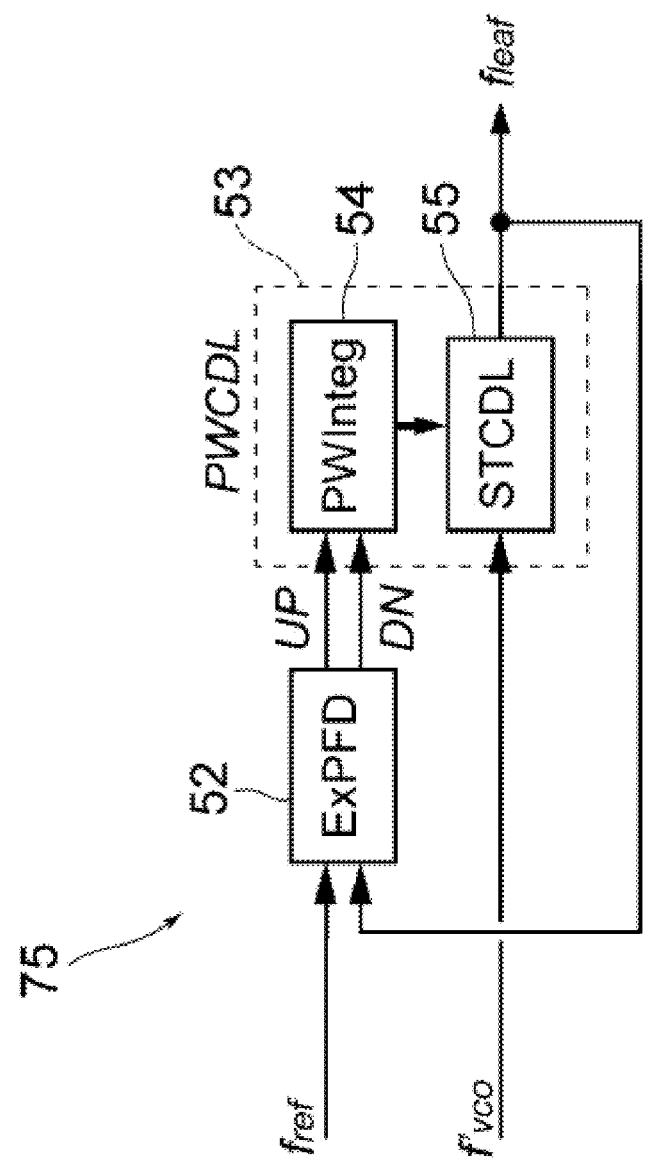
FIG. 19 shows a block diagram indicating a whole configuration of a delay adjustment circuit in accordance with the present invention.

In the embodiment described above, the delay adjustment circuit 51 is embedded in the phase control 50 in order to control the delay of the PLL output signal fVCO outputted from the PLL circuit 1 in FIG. 1. The present invention may be embodied otherwise. As shown in FIG. 19 where the same signs with those in FIG. 13 are put to the corresponding parts, the delay adjustment circuit 75 may be utilized as a single body.

Then, the delay adjustment circuit 75 is configured to control the delay of the PLL output signal $f_{VCO}$ received as an external input signal outputted from the PLL circuit 1. In addition, the delay adjustment circuit 75 is configured to control, based on a soft thermometer code, the delay of the output signal f'$_{VCO}$ received as an external input signal outputted from the conventional PLL circuit with other configuration or from kinds of other circuits. And then, the delay adjustment 75 is configured to generate a phase controlled signal whose phase is controlled to match the phase of the terminal output signal $f_{leaf}$ outputted PWCDL 53 based on the input signal $f_{ref}$ inputted from an input unit and a different frequency from the input signal $f_{ref}$. Here, because the delay control circuit 75 is similarly configured with the delay control circuit 51 shown in FIG. 13, the delay control circuit 75 is not described in detail.

Figure 20:
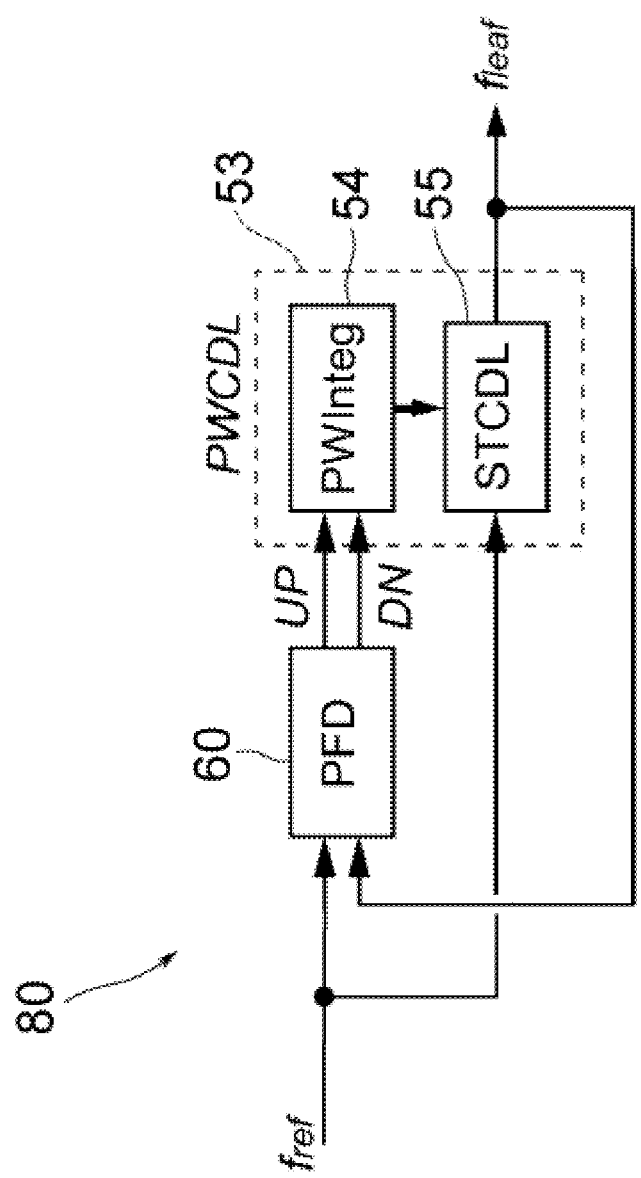
FIG. 20 shows a block diagram indicating a whole configuration of a delay adjustment circuit in accordance with another embodiment.

Additionally, the delay adjustment circuit may be embodied, as shown in FIG. 20 where the same signs with those in FIG. 19 are put to the corresponding parts, by a delay adjustment circuit 80 where the conventional PFD 60 is utilized instead of the ExPFD 52 and the input signal $f_{ref}$ inputted from the input unit is input to the PFD 60 and the STCDL 55. The delay adjustment circuit 80 is configured to generate a terminal output signal $f_{leaf}$ outputted from the PWCDL 53. The terminal output signal $f_{leaf}$ has the same frequency with that of the input signal $f_{ref}$ which has a standard clock frequency (or simply called clock frequency) inputted from the input unit, as in the case with the conventional DLL circuit. The terminal output signal $f_{leaf}$ is generated as the phase controlled signal by delaying the input signal $f_{ref}$ by one period, for example, using a soft thermometer code.

The invention claimed is:

1. A signal conversion circuit for generating a signal according to an inputted pulse signal while receiving pulse width of the pulse signal,
    wherein the signal conversion circuit takes samples from the pulse signal, converts the pulse signal into binary digital output values comprising two values based on signal values taken as the samples, converts the pulse signal into an analog intermediate output value which is between the two values based on signal values taken as the samples only when the digital output values are changing between the two values, and generates a converted signal having the digital output values and the intermediate output value.

2. The signal conversion circuit of claim 1,
    comprising a signal processing unit that prolongs time while the pulse signal falls from maximum to minimum or time while the pulse signal rises from minimum to maximum, and
    wherein the signal conversion circuit takes samples from the pulse signal with prolonged time while values of the pulse signal transits.

3. The signal conversion circuit of claim 2,
    further comprising a pulse transition detection unit that detects a boundary where the pulse signal falls from maximum to minimum or a boundary where the pulse signal rises from minimum to maximum,
    wherein the signal conversion circuit takes samples from the pulse signal when detection result is obtained from the pulse transition detection unit.

4. The signal conversion circuit of claim 3,
    further comprising a delay unit that delays the pulse signal,
    wherein delay time by the delay unit is larger than delay time caused by the pulse transition detection unit at detection of transition of the pulse signal.

5. The signal conversion circuit of claim 1,
    wherein the pulse signal has a first pulse signal that indicates phase difference of two frequencies and a second pulse signal that indicates rising of later of the two frequencies, and
    wherein, while the converted signal is generated, the signal conversion circuit generates an analog variation based on difference width between a pulse width of the first pulse signal and a pulse width of the second pulse width and the signal conversion circuit shifts the intermediate output value by the analog variation.

6. A PLL circuit that compares phase of an input signal and phase of an output signal from an oscillation circuit to detect phase difference and generates an intended oscillation signal by controlling the oscillation circuit based on the phase difference, wherein the oscillation circuit generates the oscillation signal whose oscillation frequency is adjusted according to the converted signal outputted by the signal conversion circuit of any of claims 1 through 4.

7. A delay adjustment circuit that compares phase of an input signal and phase of a delayed output signal obtained via a pulse width controlled delay circuit to detect phase difference and generates an intended phase adjusted signal by controlling delay at the pulse width controlled delay circuit based on the phase difference,
- wherein the pulse width controlled delay circuit includes the signal conversion circuit of either of claim 1 or 5, and
- wherein the pulse width controlled delay circuit generates the phase adjusted signal delayed according to the converted signal outputted from the signal conversion circuit.

8. The delay adjustment circuit of claim 7,
- wherein an external input signal having a different frequency from that of the input signal is inputted into the signal conversion circuit, and
- wherein the signal conversion circuit delays the external input signal according to the converted signal generated based on phase difference between phase of the input signal and phase of the delayed output signal.

9. A phase control circuit comprising:
- a PLL circuit that compares phase of an input signal and phase of an output signal from an oscillation circuit to detect phase difference and generates an intended oscillation signal by controlling the oscillation circuit based on the phase difference; and
- a delay adjustment circuit that compares phase of the input signal and phase of a delayed output signal obtained via a pulse width controlled delay circuit to detect phase difference and generates an intended phase adjusted signal by controlling, at the pulse width controlled delay circuit and based on the phase difference, delay of the oscillation signal outputted from the PLL circuit,
wherein the pulse width controlled delay circuit includes:
- a signal conversion circuit that takes samples from a pulse signal generated based on phase difference between the input signal and the delayed output signal, converts the pulse signal into binary digital output values comprising two values based on signal values taken as the samples, converts the pulse signal into an analog intermediate output value which is between the two values based on signal values taken as the samples only when the digital output values are changing between the two values, and generates a converted signal having the digital output values and the intermediate output value; and
- a control circuit that generates the phase adjusted signal by delaying the oscillation signal according to the converted signal.

10. The phase control circuit of claim 9,
- wherein the PLL circuit generates the oscillation signal whose oscillation frequency is adjusted according to the converted signal outputted by the signal conversion circuit of any of claims 1 through 4.

\* \* \* \* \*